(12) United States Patent
Phee et al.

(10) Patent No.: US 8,575,760 B2
(45) Date of Patent: Nov. 5, 2013

(54) SEMICONDUCTOR DEVICES HAVING ELECTRODES

(75) Inventors: Jae-hyun Phee, Incheon (KR); Uihyouong Lee, Seoul (KR); Ju-il Choi, Suwon-si (KR); Jung-Hwan Kim, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 6 days.

(21) Appl. No.: 13/303,255

(22) Filed: Nov. 23, 2011

(65) Prior Publication Data

US 2012/0133041 A1 May 31, 2012

(30) Foreign Application Priority Data

Nov. 26, 2010 (KR) .................. 10-2010-0118960

(51) Int. Cl.
*H01L 23/498* (2006.01)

(52) U.S. Cl.
USPC ............ 257/774; 257/E23.068; 257/E23.011; 257/E23.145; 257/737; 257/738; 257/773; 257/621; 257/730; 257/786

(58) Field of Classification Search
USPC .......... 257/737, 738, E23.068, 774, 773, 621, 257/E23.011, 730, 786, E23.145
See application file for complete search history.

(56) References Cited

U.S. PATENT DOCUMENTS

| 6,054,171 | A | 4/2000 | Shoji | |
|---|---|---|---|---|
| 7,309,244 | B2 * | 12/2007 | Yamada et al. | 439/91 |
| 7,504,722 | B2 * | 3/2009 | Ochiai | 257/730 |
| 8,399,987 | B2 * | 3/2013 | Kwon et al. | 257/730 |
| 2005/0200658 | A1 * | 9/2005 | Furukawa | 347/55 |
| 2005/0215086 | A1 * | 9/2005 | Sato et al. | 439/71 |
| 2008/0157287 | A1 * | 7/2008 | Choi et al. | 257/621 |
| 2010/0123256 | A1 * | 5/2010 | Yoda et al. | 257/774 |

FOREIGN PATENT DOCUMENTS

| JP | 10-098045 | 4/1998 |
|---|---|---|
| JP | 2001-044240 | 2/2001 |
| KR | 1019990037053 | 5/1999 |
| KR | 1020030060897 | 7/2003 |

* cited by examiner

*Primary Examiner* — A O Williams

(74) *Attorney, Agent, or Firm* — Myers Bigel Sibley & Sajovec, PA

(57) ABSTRACT

A semiconductor device includes a substrate having a first surface and an opposite second surface. An electrode extends within the substrate towards the first surface and has a protruding portion extending from the first surface. A supporting portion extends from the first surface of the substrate to a sidewall of the protruding portion and supports the protruding portion.

25 Claims, 48 Drawing Sheets

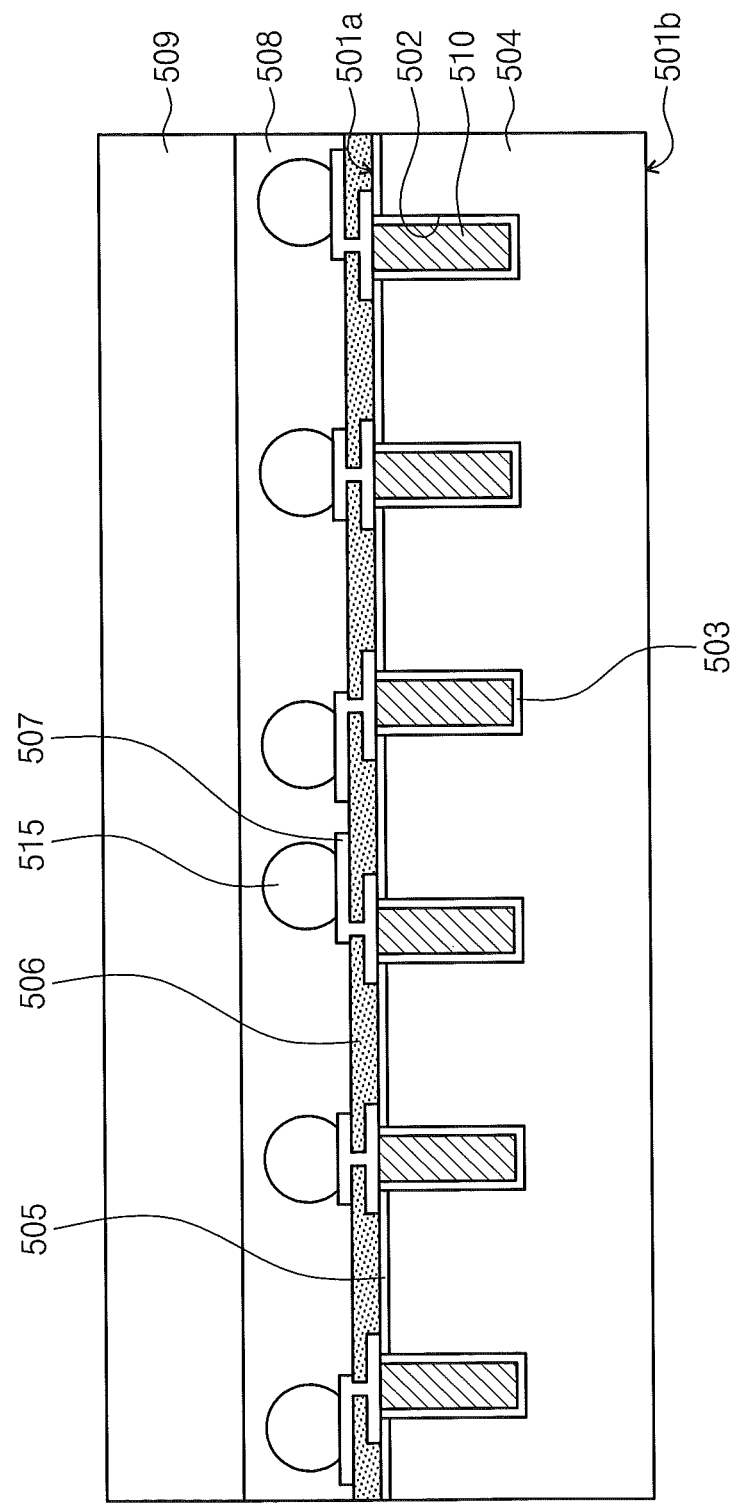

SEMICONDUCTOR DEVICES HAVING ELECTRODES

CROSS-REFERENCE TO RELATED APPLICATION

This U.S. non-provisional patent application claims priority under 35 U.S.C. §119 of Korean Patent Applications No. 10-2010-0118960, filed on Nov. 26, 2010, the entire contents of which are hereby incorporated by reference.

BACKGROUND

The present disclosure herein relates to semiconductor devices, and more particularly, to semiconductor devices having an electrode and methods of fabricating the same.

As the trends for miniaturized, lightened, high-speed, and high-capacity electronic products are advanced, future directions for developing semiconductor devices used in the electronic products are also being changed. A basic direction of such change is to comply with the future directions for developing the electronic products. Recently, the technology for semiconductor devices has been actively developed in order to include a plurality of semiconductor chips in a single semiconductor device by stacking the semiconductor chips. Semiconductor packaging technology may be suitable to significantly reduce the areas occupied by semiconductor packages, fabricate a memory having high capacity, and integrate functions of various semiconductor devices into one device, such as a system-in-package (SIP).

Methods of stacking semiconductor chips may include changing an upper structure of a semiconductor chip by separately performing a redistribution process on the semiconductor chip, or forming a through electrode in a semiconductor chip. The semiconductor package using the through electrode may have advantages of fabricating high-performance, high-density, and low-profile semiconductor products.

SUMMARY

Some embodiments provide a semiconductor device including a substrate having a first surface and an opposite second surface. An electrode extends within the substrate towards the first surface and has a protruding portion extending from the first surface. A supporting portion extends from the first surface of the substrate to a sidewall of the protruding portion that supports the protruding portion. The substrate and the supporting portion may be a same material.

In other embodiments, the supporting portion has a height (H) proximate the sidewall of the protruding portion of at least half of a height (T) of the protruding portion extending from the first surface. The supporting portion may have a conical shape with the electrode extending along a central axis of the conical shape. A length (L) of a base of the conical shape from the sidewall of the electrode to a flat portion of the first surface may be at least half the height (H) of the supporting portion. The supporting portion may surround at least half of a circumference of the protruding portion.

In further embodiments, an insulation layer is on the first surface. The insulation layer is not on an upper surface of the protruding portion. The insulation layer has an obtuse folding angle of at least 90° on the supporting surface to limit defects in the insulation layer proximate the protruding portion.

In other embodiments, an insulation layer is disposed between the electrode and the substrate. The insulation layer disposed between the electrode and the substrate extends on the sidewall of the protruding portion to a height at least equal to the height (H) of the supporting portion. The protruding portion may be a first protruding portion and the supporting portion may be a first supporting portion and the electrode may further include a second protruding portion extending from the second surface. The semiconductor device may further include a second supporting portion extending from the second surface of the substrate to a sidewall of the second protruding portion that supports the second protruding portion.

In yet other embodiments, the semiconductor device includes a plurality of electrodes extending through the substrate form the first surface to the second surface, each of which has a protruding portion. The semiconductor device further includes a plurality of supporting portions, each of which supports a respective one of the protruding portions. Ones of the electrodes may have different pitches (P) between each other and a minimum pitch between adjacent ones of the electrodes may be small enough so that the first surface of the substrate between the adjacent ones of the electrodes does not include a flat portion as the respective supporting portions of the adjacent ones of the electrodes overlap.

In other embodiments, a semiconductor package is provided including the semiconductor device and further including a package substrate having the first side of the semiconductor device mounted thereto and having interconnection lines formed therein. The electrodes are electrically connected to the interconnection lines. The semiconductor device may include a plurality of connecting portions on an upper surface of respective ones of the protruding portion and extending over at least a portion of the supporting portions of the respective ones of the protruding portions that electrically connect the electrodes to the interconnection lines. The semiconductor device may be a first semiconductor device having a metal interconnection on the second surface electrically connected to respective ones of the electrodes and the semiconductor package may further include a second semiconductor mounted on the second surface of the first semiconductor device and having a plurality of electrodes therein that are electrically connected to respective ones of the electrodes of the first semiconductor device through the metal interconnection.

In yet further embodiments, a method of fabricating a semiconductor device includes providing a substrate having a first surface, a second surface opposite the first surface and an electrode extending within the substrate. The first surface is recessed to provide a recessed first surface and a protruding portion of the electrode extending from the recessed first surface and a supporting portion extending from the recessed first surface of the substrate to a sidewall of the protruding portion that supports the protruding portion.

In other embodiments, recessing the first surface includes forming the supporting portion to have a conical shape with the electrode extending along a central axis of the conical shape wherein the supporting portion has a height (H) proximate the sidewall of the protruding portion of at least half of a height (T) of the protruding portion extending from the first surface. Recessing the first surface may include forming the supporting portion to have a length (L) of a base of the conical shape from the sidewall of the electrode to a flat portion of the first surface of at least half the height (H) of the supporting portion. Recessing the first surface of the substrate may comprise chemical mechanical polishing the first surface using a slurry including water, silica, and an amine-based compound.

In further embodiments, the method includes forming an insulation layer covering the protruding portion of the electrode and the recessed lower surface. The insulation layer is selectively removed to form a protective layer exposing the protruding portion of the through electrode. The insulation layer has a folding portion formed on the supporting portion and a folding angle between a horizontal component and a vertical component of the insulation layer constituting the folding portion is at least about 90°.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 5A through 5K illustrate a method of fabricating a semiconductor device according to some embodiments of the inventive concept, in which FIG. 5F is a perspective view and the others are cross-sectional views;

FIG. 5E is an enlarged view illustrating a portion of FIG. 5D;

FIG. 5H is an enlarged view illustrating a portion of FIG. 5G;

FIG. 9C is an enlarged view illustrating a portion of FIG. 9B;

FIGS. 13A through 13K are cross-sectional views illustrating a method of fabricating a semiconductor package including a semiconductor device according to some embodiments of the inventive concept, in which FIGS. 13E and 13G are enlarged views illustrating portions of FIGS. 13D and 13F, respectively;

DETAILED DESCRIPTION OF THE EMBODIMENTS

Figure 1A:
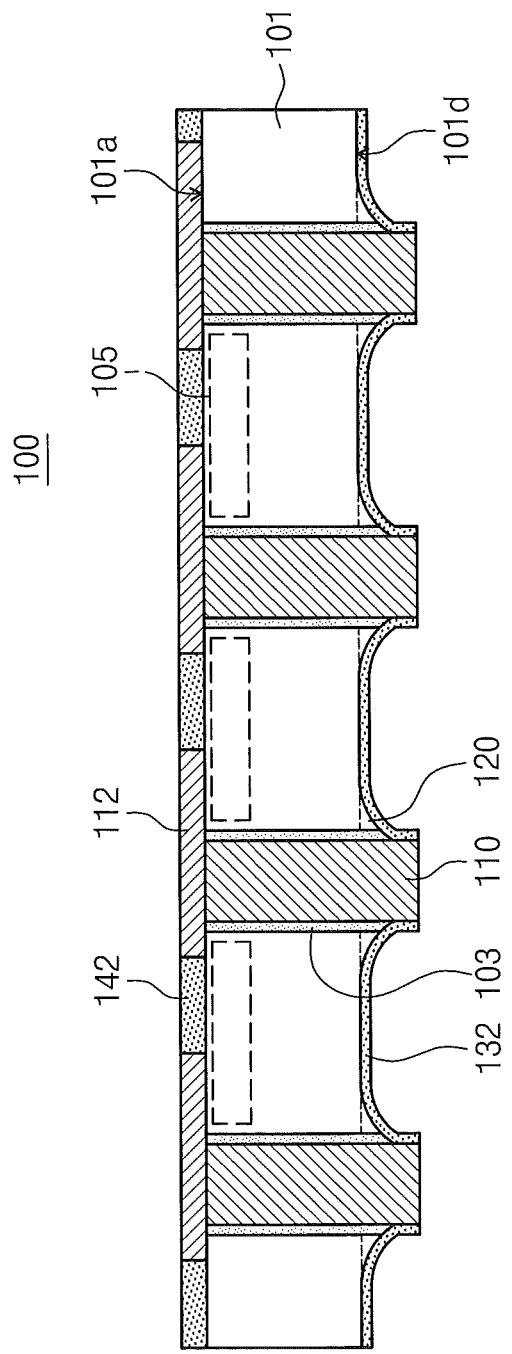
FIG. 1A is a cross-sectional view illustrating a semiconductor device according to some embodiments of the inventive concept.

Hereinafter, a semiconductor device and a method of fabricating the same according to the inventive concept will be described in detail with reference to the accompanying drawings.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1B:
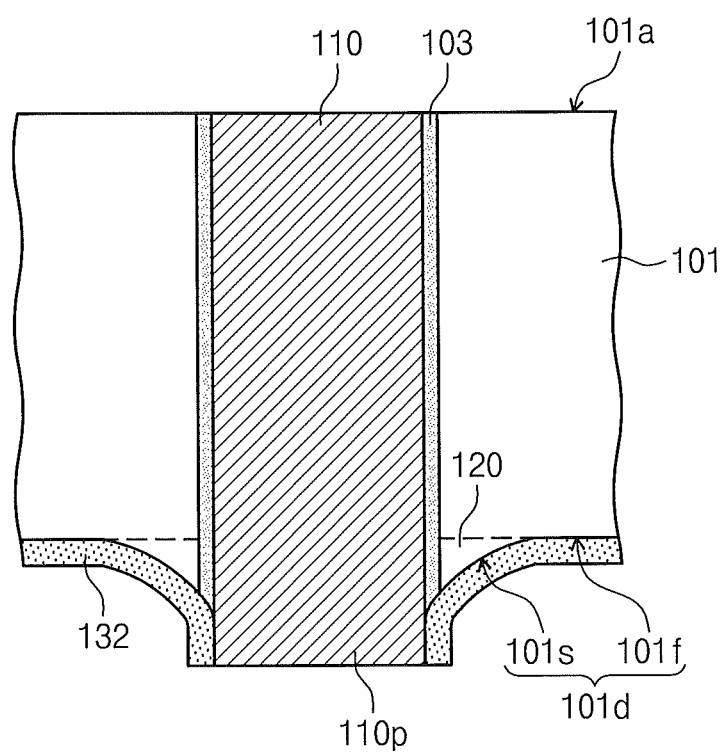
FIG. 1B is an enlarged view illustrating a portion of FIG. 1A.

Some embodiments will now be described with reference to FIGS. 1A and 1B. FIG. 1A is a cross-sectional view illustrating a semiconductor device according to some embodiments of the inventive concept. FIG. 1B is an enlarged view illustrating a portion of FIG. 1A. Referring to FIGS. 1A and 1B, a semiconductor device 100 may be a semiconductor chip including a plurality of through electrodes 110 penetrating a substrate 101. The substrate 101 has an upper surface 101a and a lower surface 101d opposite to the upper surface 101a. Both ends of the through electrode 110 may be exposed through the upper surface 101a and the lower surface 101d, respectively. The upper surface 101a may be an active surface on which a circuit pattern 105 is formed. The circuit pattern 105 may be a memory circuit, a non-memory circuit, or combinations thereof. The through electrode 110 may include a protruding portion 110p protruding from the lower surface 101d. As another example, the through electrode 110 may protrude from the upper surface 101a. The semiconductor device 100 may further include a metal interconnection 112 electrically connected to the through electrode 110, protective layers 142 and 132 covering the upper and lower surfaces 101a and 101d, and an insulation layer 103 surrounding a side of the through electrode 110 and insulating it from the substrate 101. The protective layer 142 on the upper surface 101a may expose the metal interconnection 112, and the protective layer 132 on the lower surface 101d may expose the protruding portion 110p of the through electrode 110. The through electrode 110 may be electrically connected to the circuit pattern 105 to be used as a path for electrical signals or may not be electrically connected to the circuit pattern 105.

According to the illustrated embodiments, the lower surface 101d may have a flat surface 101f and an inclined surface 101s, and the inclined surface 101s may have an upward slope (shown as toward the bottom of the page in FIG. 1B) from the flat surface 101f toward the through electrode 110. The substrate 101 may include a tail 120 obliquely protruding from the flat surface 101f of the lower surface 101d. The tail 120 may be defined by the inclined surface 101s. For example, the tail 120 may have a conical shape in which the through electrode 110 is disposed along the central axis. The tail 120 may surround the protruding portion 110p of the through electrode 110 and may support the through electrode 110 such that the through electrode 110 does not fall down when stress is applied to the through electrode 110. The tail 120 may be formed of the same material as the substrate 101, e.g., silicon (Si).

Figure 2A:
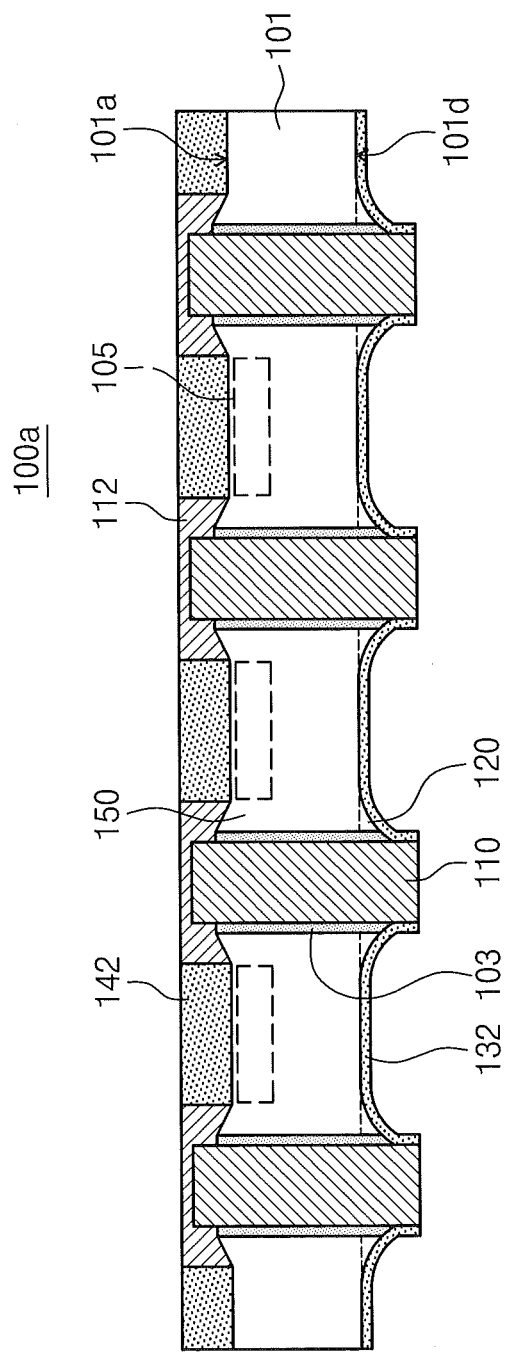
FIG. 2A is a cross-sectional view illustrating a semiconductor device according to come embodiments of the inventive concept.
Figure 2B:
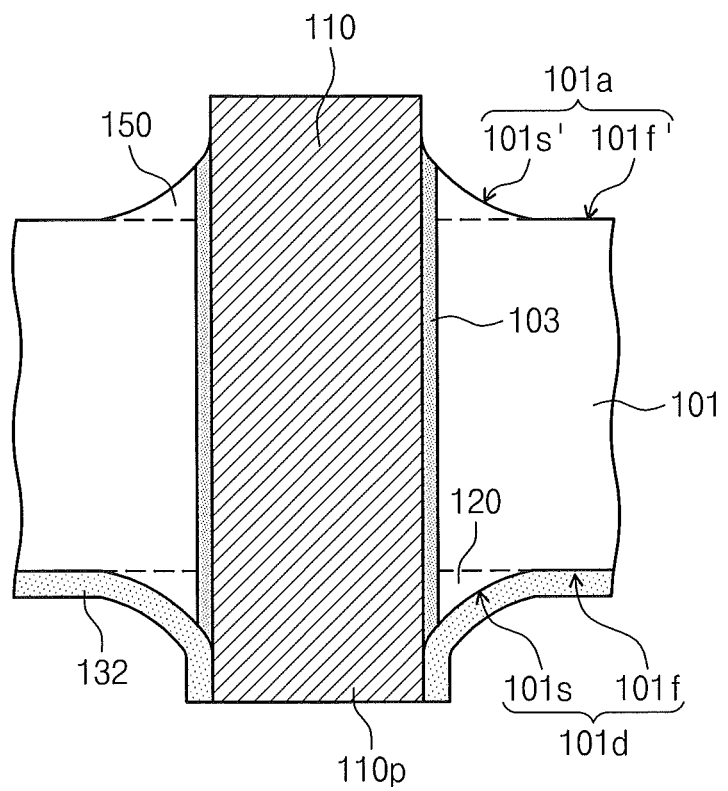
FIG. 2B is an enlarged view illustrating a portion of FIG. 2A.

FIG. 2A is a cross-sectional view illustrating a semiconductor device according to other embodiments of the inventive concept. FIG. 2B is an enlarged view illustrating a portion of FIG. 2A. Referring to FIGS. 2A and 2B, a semiconductor device 100a may include a substrate 101 in which a tail 120 is included on a lower surface 101d and a through electrode 110 is formed, similarly to the semiconductor device 100 of FIGS. 1A and 1B. According to the illustrated embodiments of FIGS. 2A and 2B, an upper surface 101a may include a flat surface 101f' and an inclined surface 101s', identically or similarly to the lower surface 101d of FIGS. 1A and 1B, and the inclined surface 101s' may define a tail 150 surrounding the through electrode 110. The tail 150 may have a conical shape in which the through electrode 110 is disposed along the central axis, identically or similarly to the tail 120. Both ends of the through electrode 110 may protrude through the upper and lower surfaces 101a and 101d as illustrated in FIGS. 2A and 2B, and protruding portions thereof may be surrounded by the tails 120 and 150. Except for the foregoing description, the semiconductor device 100a may have a configuration identical or similar to the semiconductor device 100 of the device of FIGS. 1A and 1B.

Figure 3A:
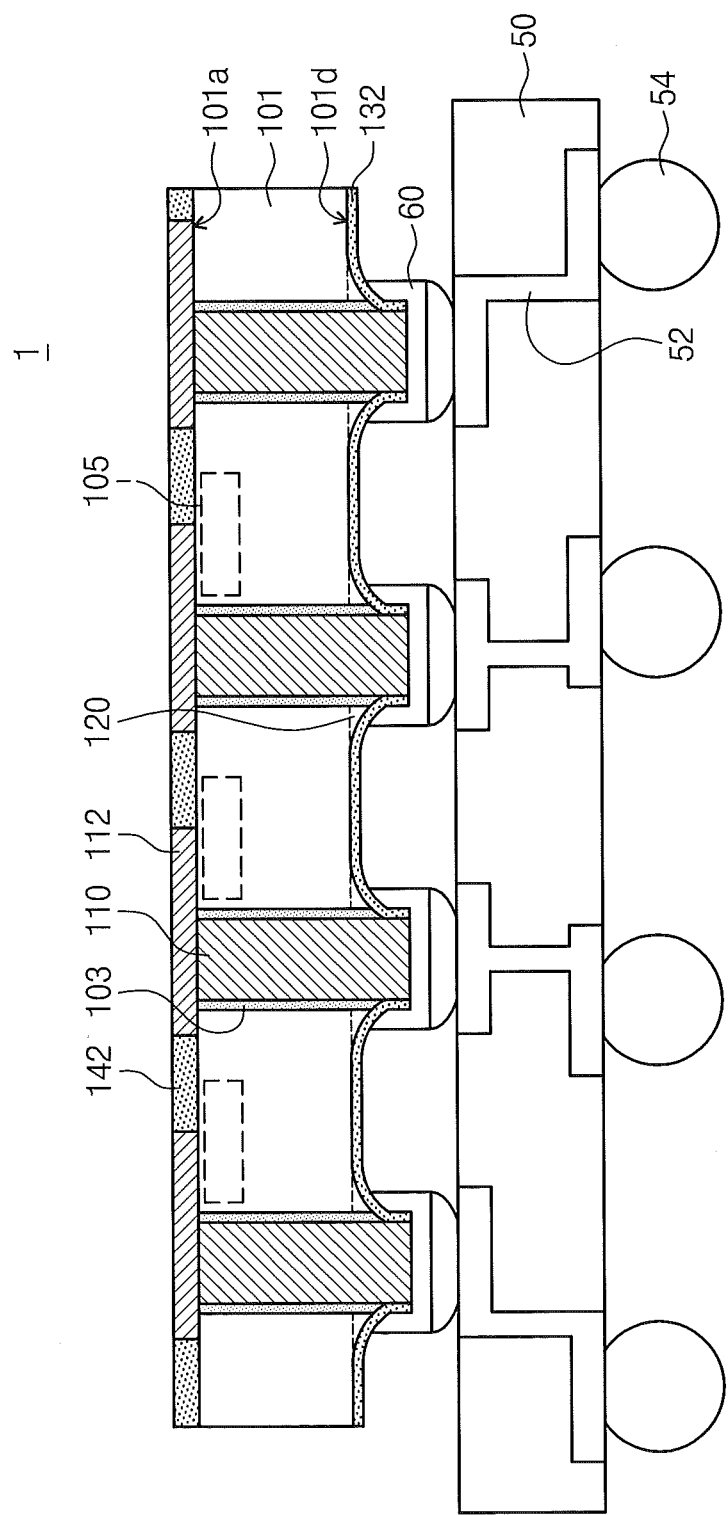
FIG. 3A is a cross-sectional view illustrating a semiconductor package including a semiconductor device according to some embodiments of the inventive concept.
Figure 3B:
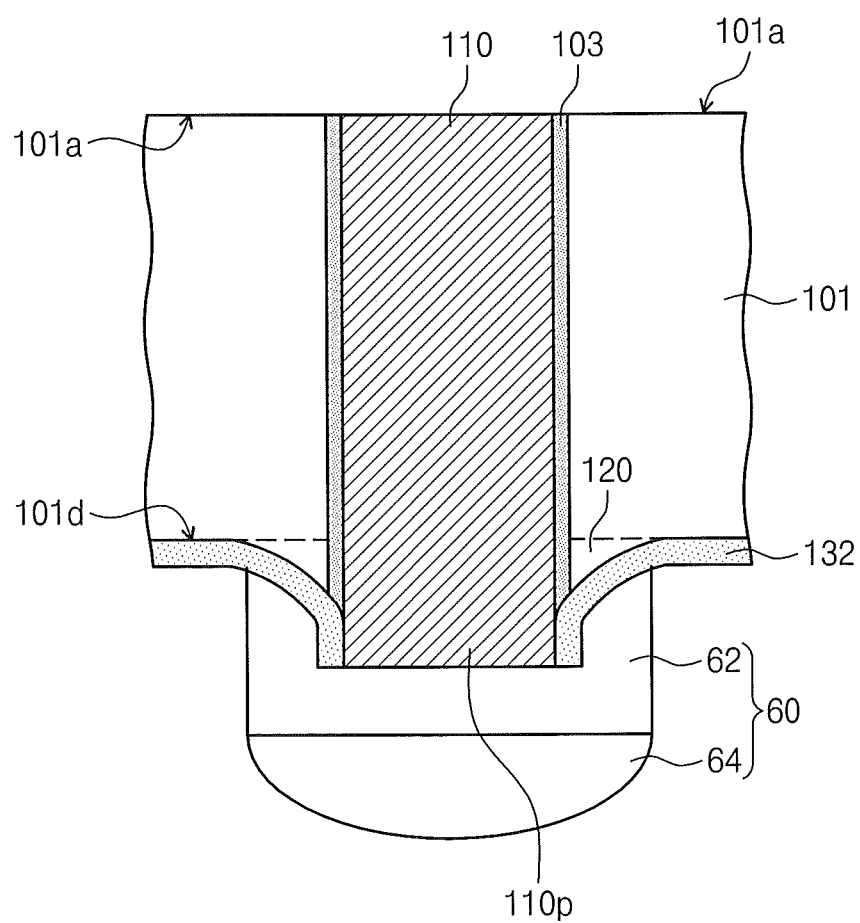
FIG. 3B is an enlarged view illustrating a portion of FIG. 3A.

FIG. 3A is a cross-sectional view illustrating a semiconductor package including a semiconductor device according to further embodiments of the inventive concept. FIG. 3B is an enlarged view illustrating a portion of FIG. 3A. Referring to FIG. 3A, a semiconductor package 1 may include a package substrate 50 and one or more semiconductor devices 100 (FIG. 1A) mounted on the package substrate 50. The semiconductor device 100 may be composed identically or similarly to the semiconductor device 100 illustrated in FIGS. 1A and 1B. The package substrate 50 may be a printed circuit board (PCB) in which interconnection lines 52 are formed inside. The semiconductor device 100 may be mounted in a state where the lower surface 101d faces the package substrate 50, and may be electrically connected to the package substrate 50 through the through electrode 110. For example, electrical connection between the semiconductor device 100 and the package substrate 50 may be achieved by directly connecting the through electrode 110 to the interconnection line 52 or by further disposing a connecting portion 60 between the through electrode 110 and the interconnection line 52. A solder ball 54, which is connected to the interconnection line 52 that connects the semiconductor package 1 to an external device, may be further included.

Referring to FIG. 3B, the connecting portion 60 may include a metal bump 62 surrounding the protruding portion 110p of the through electrode 110. The connecting portion 60 may further include a solder 64 provided on the metal bump 62. The solder 64 may further increase adhesive strength between the metal bump 62 and the interconnection line 52.

<Examples of Multi-Chip Package>

Figure 4A:
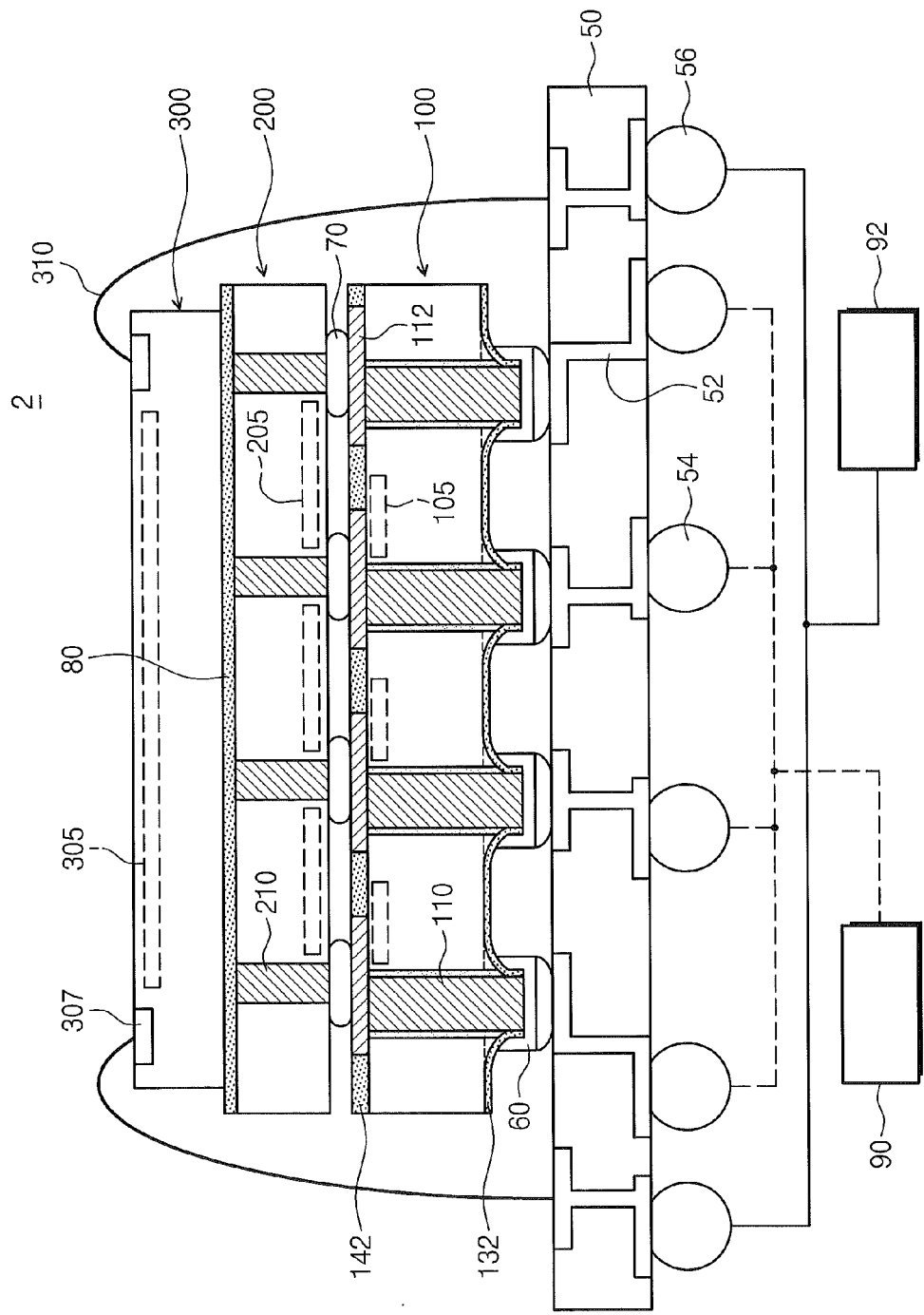
FIGS. 4A through 4C are cross-sectional views illustrating semiconductor packages including semiconductor devices according to some embodiments of the inventive concept.
Figure 4B:
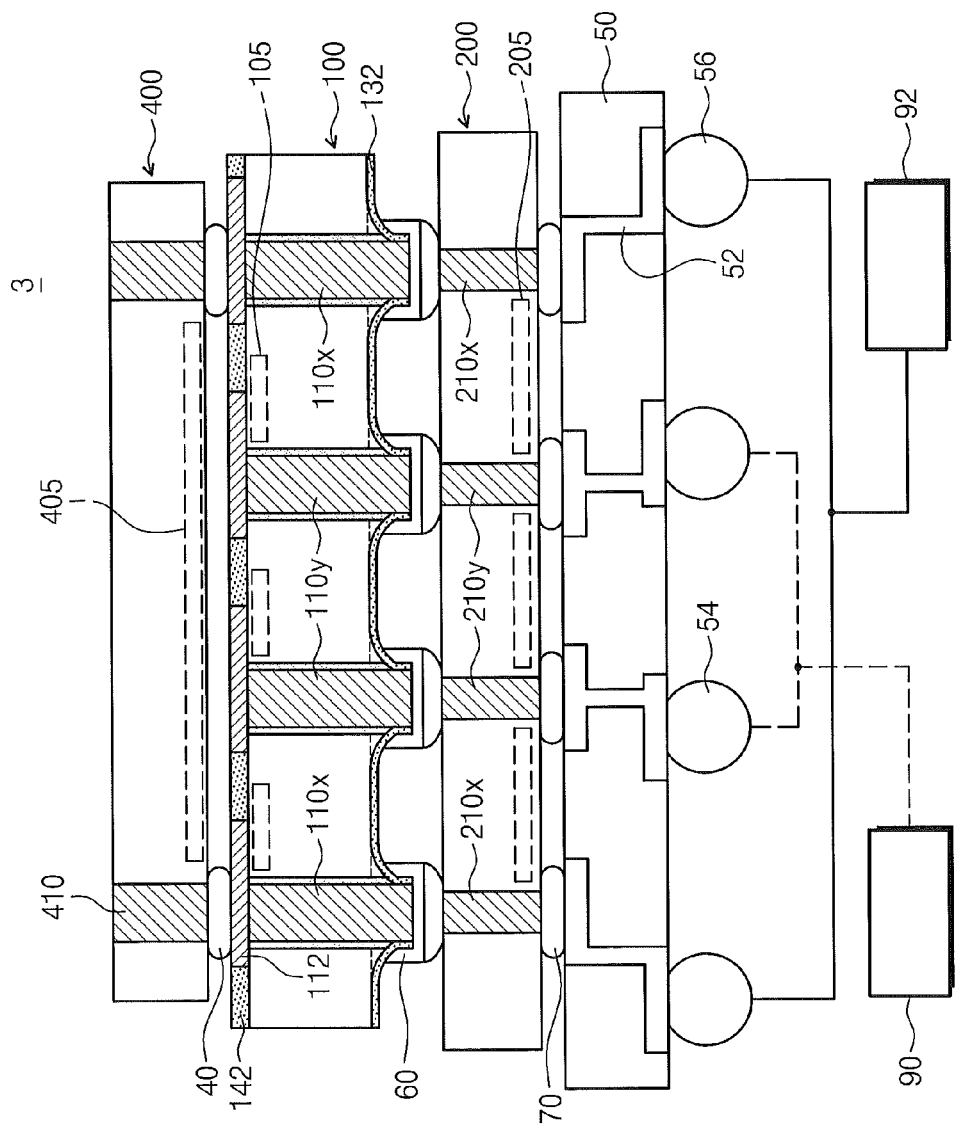
Figure 4C:
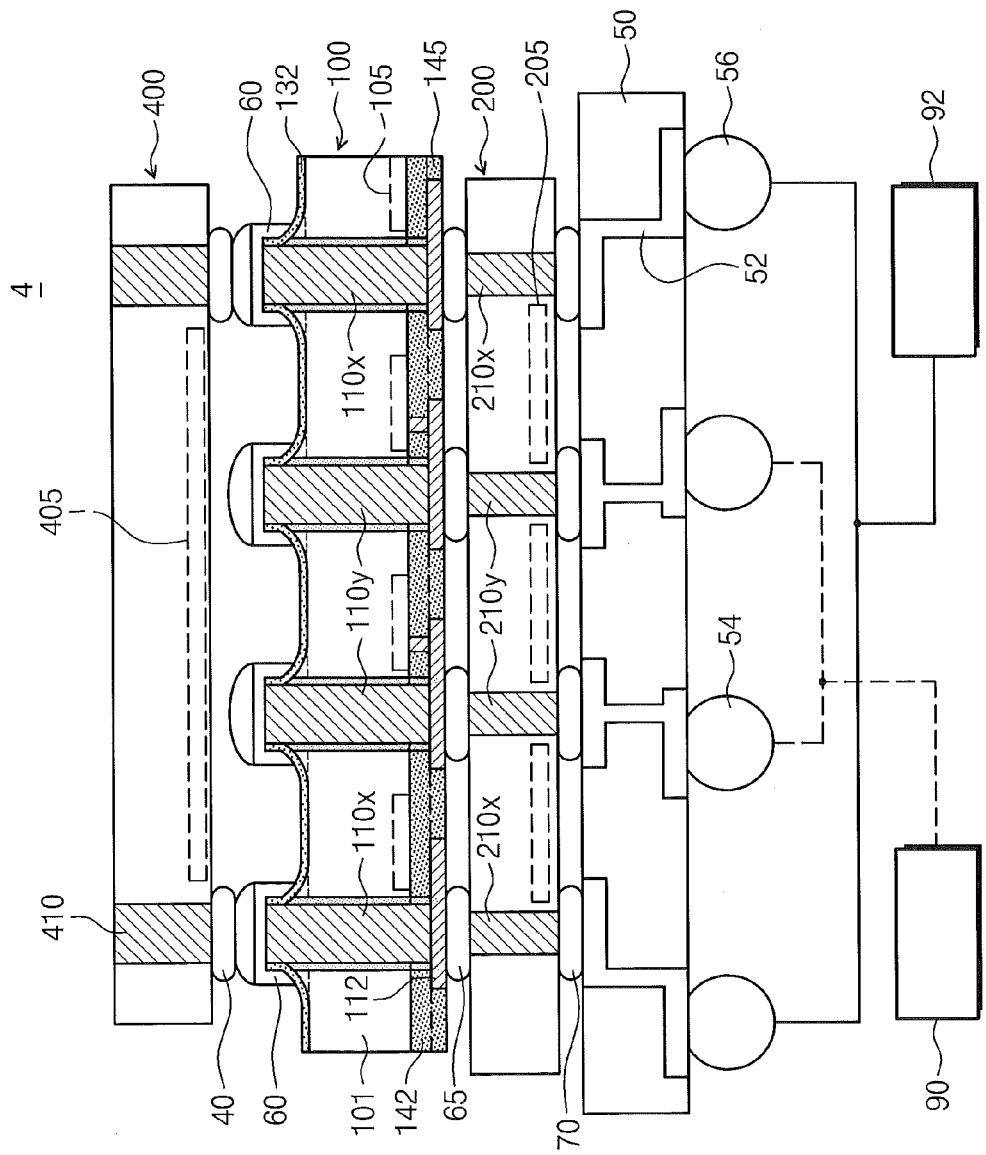

FIGS. 4A through 4C are cross-sectional views illustrating semiconductor packages including semiconductor devices according to some embodiment of the inventive concept. Referring to FIG. 4A, a semiconductor package 2 may include a package substrate 50 and semiconductor devices 100, 200 and 300 mounted on the package substrate 50. The semiconductor devices 100 to 300 may be different type devices from each other. For example, any one of the semiconductor devices 100 to 300 may be a semiconductor device for telecommunication, another may be a memory device, and the other may be another memory device or a non-memory device.

At least any one of the semiconductor devices 100 to 300, for example, the semiconductor device 100, may be composed identically or similarly to the semiconductor device illustrated in FIGS. 1A and 1B. The semiconductor device 100 may be electrically connected to the package substrate 50 by connecting the through electrode 110 to the interconnection line 52 through the connecting portion 60. The semiconductor device 200 may include a through electrode 210 electrically connected to a circuit pattern 205. For example, the semiconductor device 200 may be electrically connected to the semiconductor device 100 by flip-chip bonding. Therefore, the semiconductor device 200 may be electrically connected to the semiconductor device 100 by connecting to a metal interconnection 112 through a connecting portion 70 connected to the through electrode 210. The semiconductor device 300 may include a bonding pad 307 electrically connected to a circuit pattern 305. For example, the semiconductor device 300 may be mounted on the semiconductor device 200 by disposing an insulating adhesive layer 80 therebetween, and a bonding wire 310 connected to the bonding pad 307 may be connected to the interconnection line 52. Therefore, the semiconductor device 300 may not be directly connected to the other semiconductor devices 100 and 200, but the semiconductor device 300 may be electrically connected to the package substrate 50 through the bonding wire 310. Two bonding wires 310 are seen in FIG. 4A.

The semiconductor package 2 may be electrically connected to at least any one of first electrical device 90 and second electrical device 92. For example, the semiconductor devices 100 to 300 may be electrically connected to any one of the first and second electrical devices 90 and 92. As another example, some of the semiconductor devices 100 to 300 may be electrically connected to the first electrical device 90 and others may be electrically connected to the second electrical device 92.

As an example of the latter, the semiconductor devices 100 and 200 may be electrically connected to the first electrical device 90 (marked dotted line) and the semiconductor device 300 may be electrically connected to the second electrical device 92 (marked solid line). One or more solder balls 54 may be further provided on the package substrate 50 to electrically connect the first electrical device 90 to the package substrate 50. Similarly, one or more solder balls 56 may be further provided on the package substrate 50 to electrically connect the second electrical device 92 to the package substrate 50. Differently, the first and second electrical devices 90 and 92 may be directly connected to the package substrate 50 without the solder balls 54 and 56. The first electrical device 90 may have a function different from the second electrical device 92. As one example, the first electrical device 90 may have an image display function and the second electrical device 92 may have a telecommunication function. Thus, the semiconductor package 2, which is packaged with different types of the semiconductor devices 100 to 300, may be multifunctional.

Referring to FIG. 4B, a semiconductor package 3 may include a package substrate 50 and semiconductor devices 200, 100 and 400 mounted on the package substrate 50. The semiconductor devices 200, 100 and 400 may be different type devices from each other. For example, any one of the semiconductor devices 200, 100 and 400 may be a semiconductor device for telecommunication, another may be a memory device, and the other may be another memory device or a non-memory device.

At least any one of the semiconductor devices 200, 100 and 400, for example, the semiconductor device 100 may be composed identically or similarly to the semiconductor device illustrated in FIGS. 1A and 1B. In the semiconductor device 100, one or more ones 110x of through electrodes 110x and 110y may be dummy vias that are not electrically connected to a circuit pattern 105, and the others 110y may be vias that are electrically connected to the circuit pattern 105.

The semiconductor device 200 may include through electrodes 210x and 210y electrically connected to a circuit pattern 205 and may be electrically connected to the package substrate 50 by a flip-chip bonding method. For example, the semiconductor device 200 may be mounted on the package substrate 50 by facing down, and the through electrodes 210x and 210y may be electrically connected to the interconnection lines 52 in the package substrate 50 through connecting portions 70 or directly without the connecting portions 70. The semiconductor device 100 may be mounted on the semiconductor device 200 and may be electrically connected to the semiconductor device 200 through electrodes 110y connected to the through electrodes 210x and 210y with the medium of connecting portions 60 or directly without the connecting portions 60.

The semiconductor device 400 may include through electrodes 410 electrically connected to a circuit pattern 405 and may be mounted on the semiconductor device 100 by a flip-chip bonding method. For example, the semiconductor device 400 may be mounted on the semiconductor device 100 by facing down, and the through electrodes 410 may be connected to the dummy through electrodes 110x through connecting portions 40 or directly without the connecting portions 40.

The dummy through electrodes 110x may electrically connect the semiconductor device 400 to the semiconductor device 200 by providing a path for transmitting electrical signals between the through electrodes 410 and the through electrodes 210x. According to the illustrated embodiments of FIG. 4B, the semiconductor device 400 may not be electrically connected to the semiconductor device 100, but the semiconductor device 400 may be electrically connected to the semiconductor device 200. The semiconductor device 100 may be electrically connected to the semiconductor device 200, and the semiconductor device 200 may be electrically connected to the semiconductor device 100 and the semiconductor device 400.

Herein, the meaning of "not electrically connected to" denotes "not connected to exchange data signals" between semiconductor devices, and does not denote "electrically insulated". In other words, the meaning of "the semiconductor device 400 may not be electrically connected to the semiconductor device 100 and may be electrically connected to the semiconductor device 200." may be interpreted to include the meaning of "the semiconductor device 400 may not exchange data signals with the semiconductor device 100, and since the dummy through electrode 110$x$ of the semiconductor device 100 may be provided as a path for transmitting electrical signals between the through electrode 410 and the through electrode 210$x$, the semiconductor device 400 may exchange data signals with the semiconductor device 200 by the dummy through electrode 110$x$.". The foregoing description is the same as in FIG. 4C.

The semiconductor devices 200, 100 and 400 may be electrically connected to electrical devices 90 and 92 different from each other. For example, the semiconductor devices 100 and 200 electrically connected to each other may be electrically connected to the package substrate 50 through connecting portions 70, and may be electrically connected to the first electrical device 90 through one or more solder balls 54 adhering to the package substrate 50 or directly without the solder balls 54 (marked in dotted line). The first electrical device 90 may have a function different from the second electrical device 92, e.g., the first electrical device 90 may have an image display function and the second electrical device 92 may have a telecommunication function. Thus, the semiconductor package 3, which is packaged with different types of the semiconductor devices 100, 200 and 400 from each other, may be multifunctional.

As another example, in the semiconductor device 200, the through electrode 210$x$ connected to the dummy through electrode 110$x$ may be a dummy via that is not electrically connected to the circuit pattern 205, and the other through electrode 210$y$ may be a via that is electrically connected to the circuit pattern 205. According to such embodiments, the semiconductor device 400 may not be electrically connected to the semiconductor device 100 and the semiconductor device 200. The semiconductor device 100 and the semiconductor device 200 may be electrically connected to each other by the through electrodes 110$y$ and the through electrodes 210$y$ which are connected to each other.

Referring to FIG. 4C, a semiconductor package 4 may include different types of semiconductor devices 100, 200 and 400 from each other which are mounted on the package substrate 50. For example, any one of the semiconductor devices 100, 200 and 400 may be a semiconductor device for telecommunication, another may be a memory device, and the other may be another memory device or a non-memory device.

The semiconductor device 100 may have an identical or similar configuration to the semiconductor device illustrated in FIGS. 1A and 1B. The semiconductor device 100 may include the through electrodes 110$y$ electrically connected to the circuit pattern 105 and the dummy through electrodes 110$x$ that are not electrically connected to the circuit pattern 105. The semiconductor device 100 may include a via middle structure which includes the through electrodes 110$x$ and 110$y$ formed before forming the metal interconnections 112 and after forming the circuit pattern 105. For example, the protective layer 142 covering the circuit patterns 105 may be formed on the substrate 101, and then the through electrodes 110$x$ and 100$y$ penetrating the substrate 101 and the protective layer 142 may be formed. Subsequently, the metal interconnections 112 connected to the through electrodes 110$x$ and 110$y$, and the insulation layer 145 insulating the metal interconnections 112 may be formed on the protective layer 142. The semiconductor device 100 may be mounted on the semiconductor device 200 by flip-chip bonding, and may be electrically connected to the semiconductor device 200 by connecting portions 65 connected to the metal interconnections 112.

The semiconductor device 200 may include through electrodes 210$x$ and 210$y$ electrically connected to a circuit pattern 205 and may be electrically connected to a package substrate 50 by a flip-chip bonding method. For example, the semiconductor device 200 may be mounted on the package substrate 50 by facing down. The through electrodes 210$x$ and 210$y$ may be connected to interconnection lines 52 directly or via connecting portions 70, whereby the semiconductor device 200 may be electrically connected to the package substrate 50. The through electrodes 210$x$ and 210$y$ of the semiconductor device 200 may be connected to the through electrodes 110$x$ and 110$y$ of the semiconductor device 100.

The semiconductor device 400 may include a through electrode 410 electrically connected to a circuit pattern 405, and may be mounted on the semiconductor device 100 by a flip-chip bonding method. For example, the semiconductor device 400 may be connected to dummy through electrodes 110$x$ via connecting portions 40 or directly without the medium of the connecting portions 40.

In the above embodiments, since the dummy through electrode 110$x$ is provided as a path for transmitting electrical signals between the through electrode 410 and the through electrode 210$x$, the semiconductor device 400 may be not electrically connected to the semiconductor device 100 and may be electrically connected to the semiconductor device 200. The through electrode 110$y$ may be connected to the through electrode 210$y$ such that the semiconductor device 100 may be electrically connected to the semiconductor device 200.

The semiconductor devices 100, 200 and 400 may be electrically connected to electrical devices 90 and 92 different from each other. For example, the semiconductor devices 100 and 200 electrically connected to each other may be electrically connected to the package substrate 50 through the connecting portion 70, and may be electrically connected to the first electrical device 90 having, e.g., an image display function, through one or more solder balls 54 adhering to the package substrate 50 or without the medium of solder balls 54 (marked in dotted line). The semiconductor devices 200 and 400 electrically connected to each other may be electrically connected to the package substrate 50 through the connecting portion 70, and may be electrically connected to the second electrical device 92 having, e.g., a telecommunication function through one or more solder balls 56 adhering to the package substrate 50 or directly without the medium of solder balls 56 (marked in solid line).

As another example, in the semiconductor device 200, the through electrode 210$x$ connected to the dummy through electrode 110$x$ may be a dummy through electrode that is not electrically connected to the circuit pattern 205, and the other through electrode 210$y$ may be a via that is electrically connected to the circuit pattern 205. According to such embodiments, the semiconductor device 400 may be not electrically connected to the semiconductor devices 100 and 200, but may be electrically connected to the package substrate 50.

<Method Embodiments>

Figure 5A:
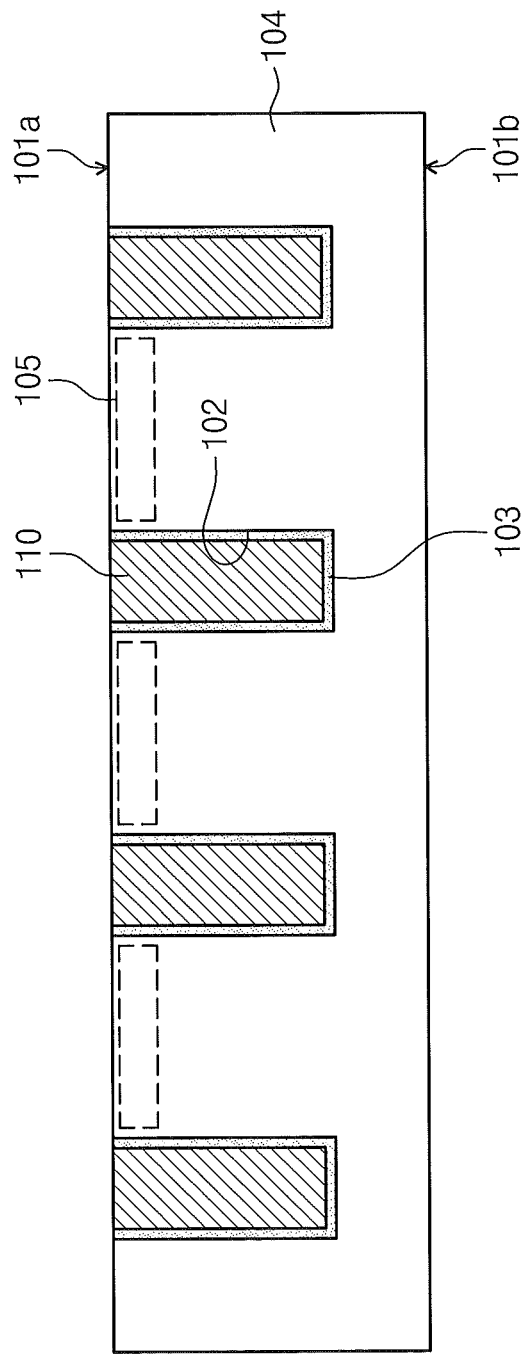
Figure 5B:
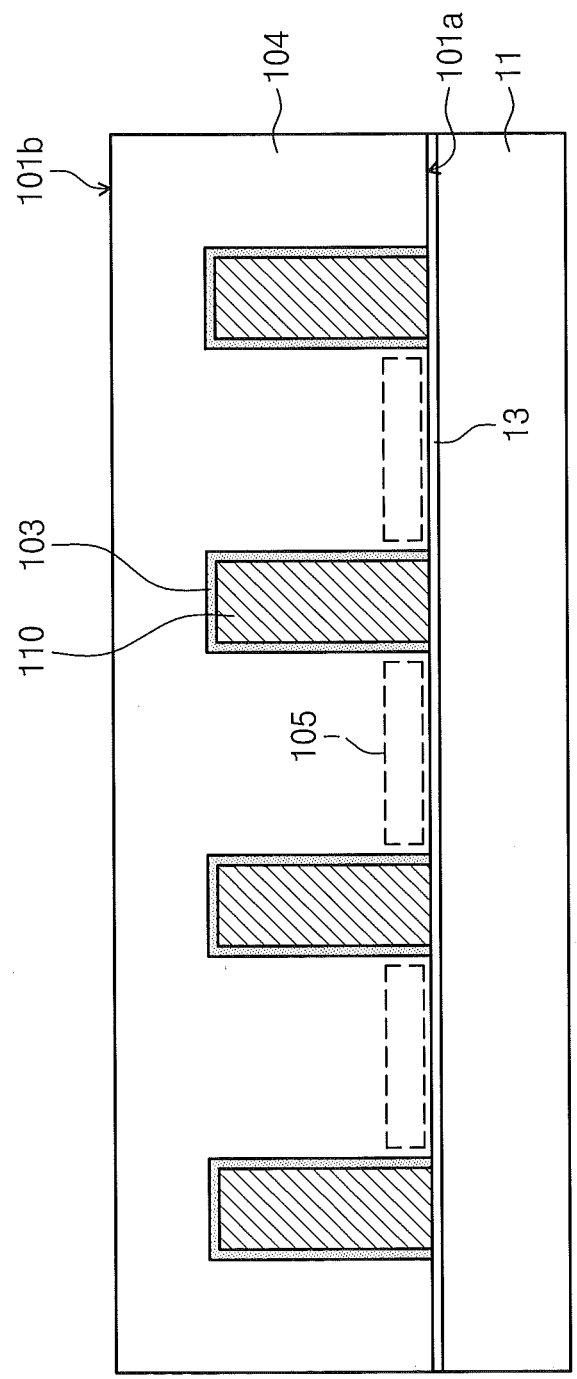
Figure 5C:
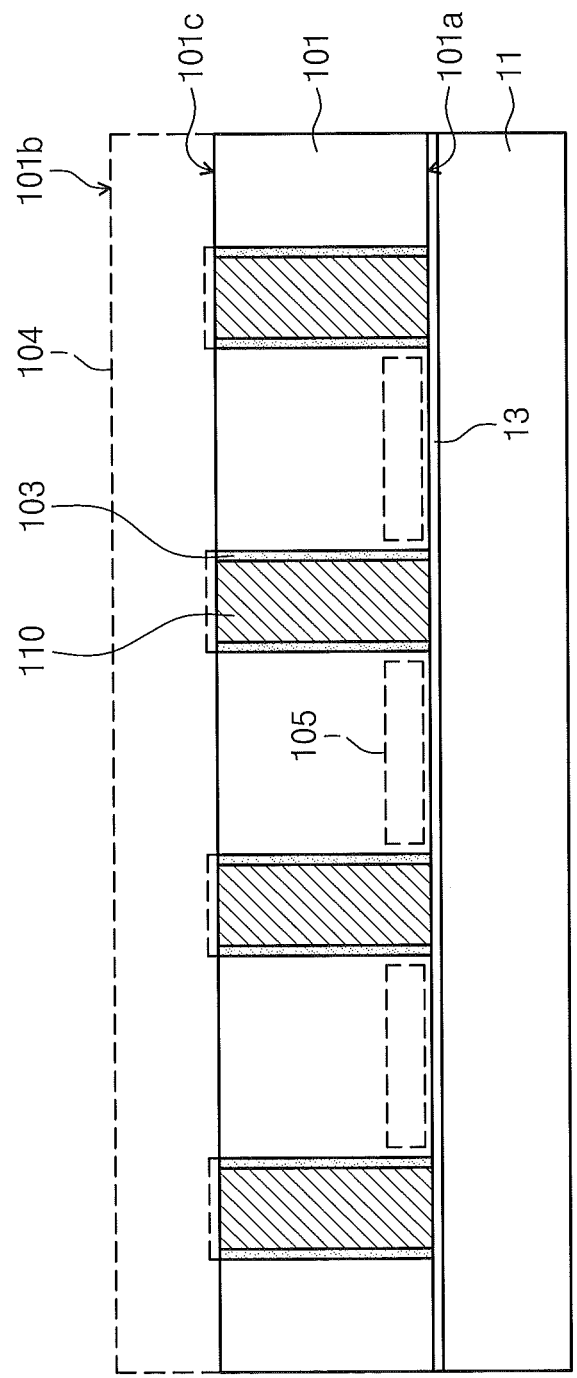
Figure 5D:
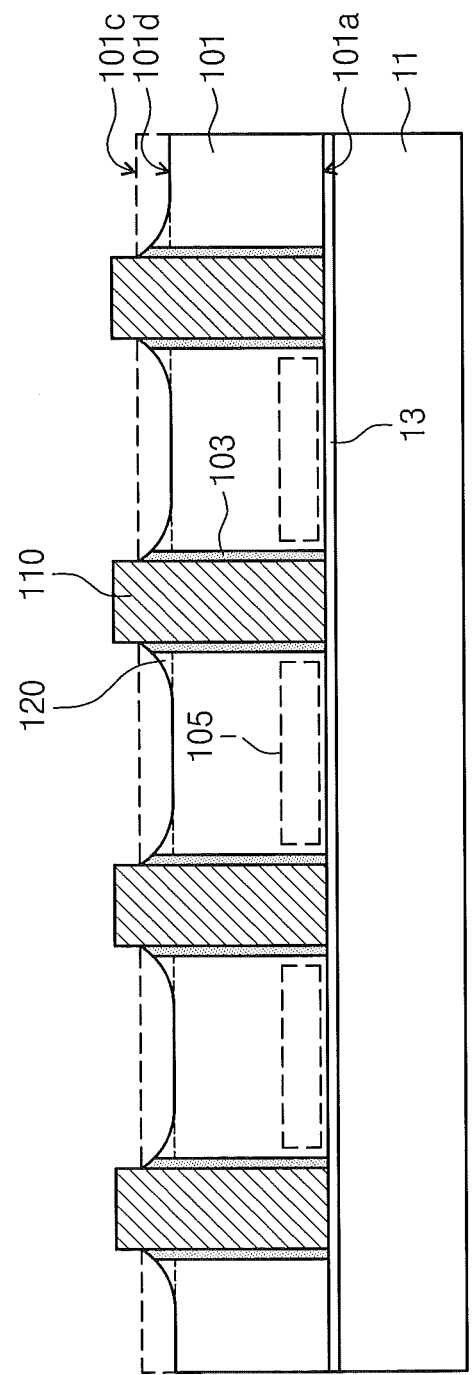
Figure 5E:
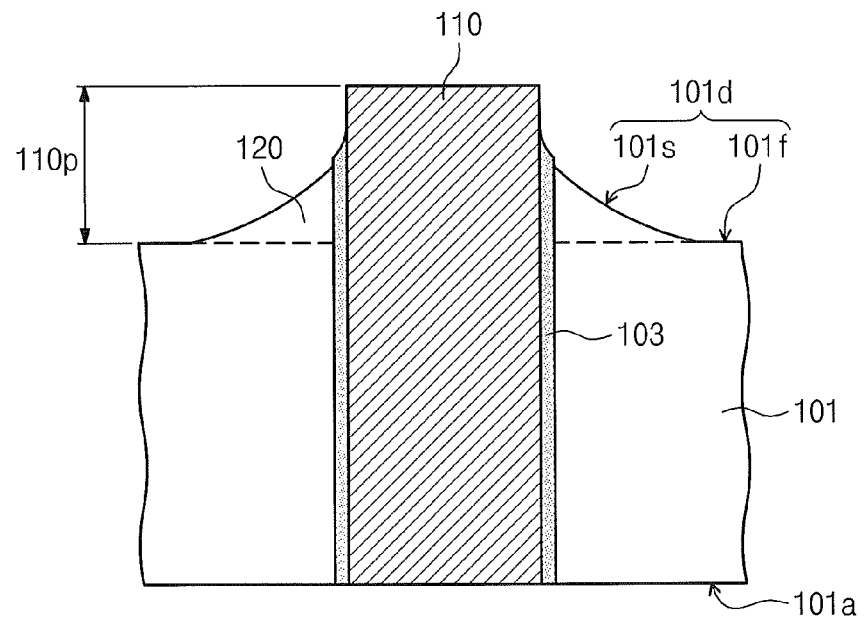
Figure 5F:
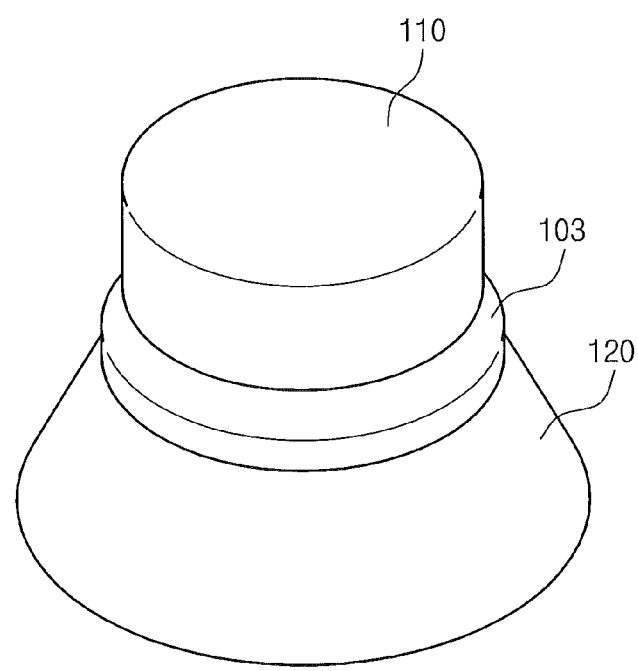
Figure 5G:
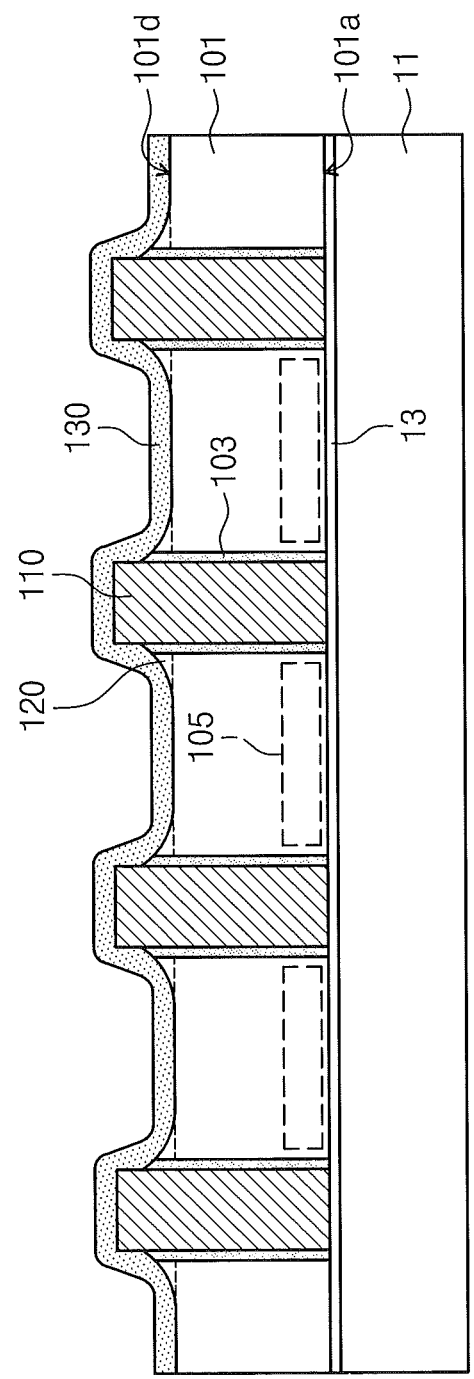
Figure 5H:
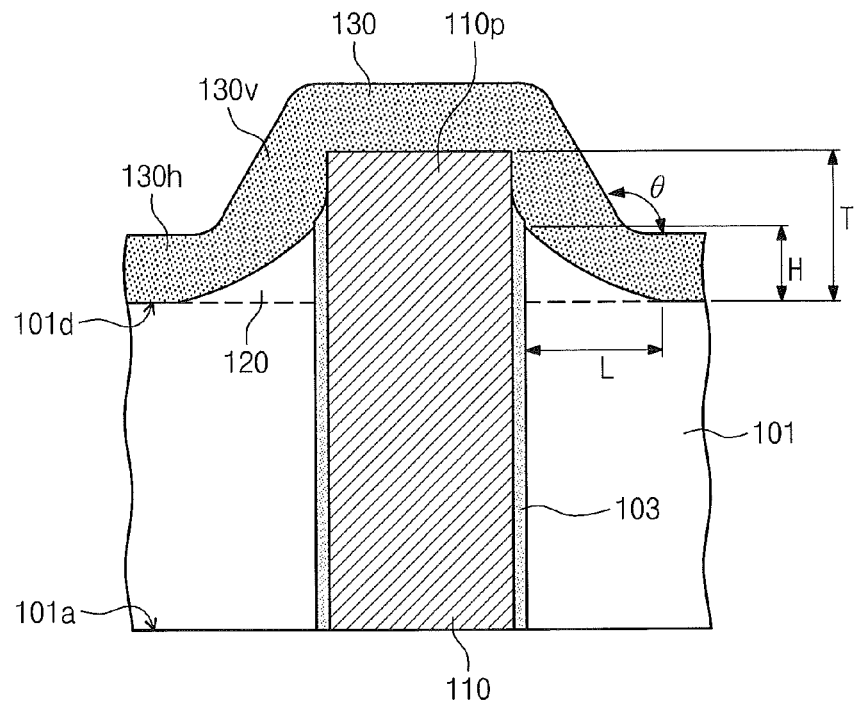

FIGS. 5A through 5K illustrate a method for fabricating a semiconductor device according to some embodiments of the inventive concept, in which FIG. 5F is a perspective view and the others are cross-sectional views. FIGS. 5E and 5H are enlarged views illustrating portions of FIGS. 5D and 5G, respectively.

Referring to FIG. 5A, a bare substrate 104 may be provided. The bare substrate 104 may have an upper surface 101a and a first lower surface 101b opposite to the upper surface 101a. The bare substrate 104 may be a silicon wafer or a silicon-on-insulator (SOI) substrate. The bare substrate 104 may be a chip-level substrate or a wafer-level substrate. The upper layer 101a of the bare substrate 104 may be an active surface on which a circuit pattern 105 is formed. The circuit pattern 105 may include a memory circuit, a non-memory circuit, or combinations thereof.

One or more through electrode 110 may be formed in the bare substrate 104. The through electrode 110 may be formed by filling a hole 102 with a conductor such as polysilicon or copper. The hole 102 may be formed through etching the bare substrate 104. An insulation layer 103 may be further formed in the hole 102 to electrically insulate the through electrode 110 from the bare substrate 104. The insulation layer 103 may be formed by depositing a silicon oxide layer or a silicon nitride layer on an inner wall of the hole 102. The hole 102 may be exposed on the upper surface 101a, but may not be exposed on the first lower surface 101b. The through electrode 110 may be formed after or before forming the circuit pattern 105. The through electrode 110 may be electrically connected to the circuit pattern 105 to provide a path for electrical signals. As another example, any of the plurality of through electrodes 110 may not be electrically connected to the circuit pattern 105.

Referring to FIG. 5B, the bare substrate 104 may be attached to a carrier 11. The carrier 11 may be composed of glass, polymer, or an insulating material similar thereto. An adhesive layer 13 may be interposed between the bare substrate 104 and the carrier 11. For example, the bare substrate 104 may be attached in a state where the upper surface 101a is flipped to face the carrier 11. Accordingly, the lower surface 101b of the bare substrate 104 may be externally exposed. The carrier 11 may support the bare substrate 104 during a subsequent process and may protect the upper surface 101a and/or the circuit pattern 105 from grinding damage or contamination. As another example, a protective film instead of the carrier 11 may be attached to the upper surface 101a of the bare substrate 104.

Referring to FIG. 5C, the bare substrate 104 may be processed to form a thinned substrate 101 to open the through electrode 110. For example, the substrate 101, which have a second lower surface 101c exposing the through electrodes 110 and have a thickness thinner than the bare substrate 104, may be formed by removing a portion of the bare substrate 104. The through electrode opening process may be performed by a grinding process such as chemical mechanical polishing (CMP), grinding, or etch back. The insulation layer 103 may be selectively removed during the grinding process.

Referring to FIG. 5D, the through electrode 110 may protrude through processing of the substrate 101. For example, a third lower surface 101d, which has a level enabling to protrude the through electrode 110, may be formed by removing a portion of the substrate 101. The third lower surface 101d may be closer to the upper surface 101a than the second lower surface 101c. The through electrode protruding process may be performed by chemical mechanical polishing, grinding, or etch back, etc.

The through electrode protruding process may be performed by a chemical mechanical polishing process using a slurry including water ($H_2O$), abrasive particles (e.g., $SiO_2$, $CeO_2$, $ZrO_2$, $TiO_2$, $Al_2O_3$), and an additive (e.g., an amine-based compound, potassium hydroxide, sodium hydroxide). For example, the chemical mechanical polishing process may use a slurry including water ($H_2O$), silica ($SiO_2$), and an amine-based compound. The amine-based compound may include quaternary ammonium, quaternary ammonium salt, ethanolamine, dimethanol amine, trimethanol amine, ethylene diamine, cetyltrimethyl ammonium bromide, cetylpyridium chloride, or combinations thereof.

The quaternary ammonium may be tetramethyl ammonium hydroxide, tetraethyl ammonium hydroxide, tetramethyl ammonium chloride, tetraethyl ammonium chloride, tetramethyl ammonium fluoride, tetraethyl ammonium fluoride, or combinations thereof.

A grinding rate of silicon (Si) constituting the substrate 101 may be changed according to the composition of the amine-based compound. For example, as grinding efficiency generally decreases when the slurry becomes acidic, the amine-based compound may increase the grinding efficiency by controlling the pH of the slurry to a basic range of about 7 to about 12.

Referring to FIGS. 5E and 5F, the third lower surface 101d (hereinafter, referred to as the "lower surface") having flat surface 101f and inclined surface 101s may be formed using the chemical mechanical polishing process. The inclined surface 101s may have an upward slope from the flat surface 101f toward the through electrode 110. As a result, a tail 120 adjacent to the through electrode 110 may be formed on the lower surface 101d of the substrate 101. The tail 120 may generally have a conical shape which has a vertical cross-section of a right triangle, and the through electrode 110 may be disposed along the central axis such that a protruding portion 110p may be surrounded by the tail 120. Therefore, the protruding portion 110p of the through electrode 110 may be supported by the tail 120. The tail 120 may have a symmetrical shape along the central through electrode 110. The tail 120 may be formed of the same material as the substrate 101, e.g., silicon (Si). The insulation layer 103 may also be recessed by grinding together with the substrate 101 during the chemical mechanical polishing process.

Referring to FIG. 5G, an insulation layer 130 may be formed on the lower surface 101d of the substrate 101. For example, the insulation layer 130 may be formed to have a thickness enough to cover the through electrode 110 on the lower surface 101d by depositing a silicon oxide layer, a silicon nitride layer, polymer (e.g., polyethylene oxide), or combinations thereof. The shape of the insulation layer 130 may be changed according to the shape of the tail 120.

Referring to FIG. 5H, the tail 120 may be formed to have a height H smaller than a height T of the protruding portion 110p of the through electrode 110. A length L of the base of the tail 120 may be smaller than, the same as, or greater than the height H. The length L of the tail 120 as illustrated in FIG. 5H is greater than the height H. This is because that the insulation layer 130 may generally have an obtuse folding angle θ of 90° or more on the tail 120 according to the shape of the tail 120 in which the length L is greater than the height H. The folding angle θ denotes an angle between a horizontal component 130h and a vertical component 130v in the insulation layer 130. When the insulation layer 130 is formed to have the obtuse folding angle θ, process defects as described below with reference to FIG. 5I may be removed. Shapes of the insulation layers 130 changing according to various shapes of the tails 120 will be described below with reference to FIGS. 6A and 6B, FIGS. 7A and 7B, and FIGS. 8A and 8B.

Figure 5I:
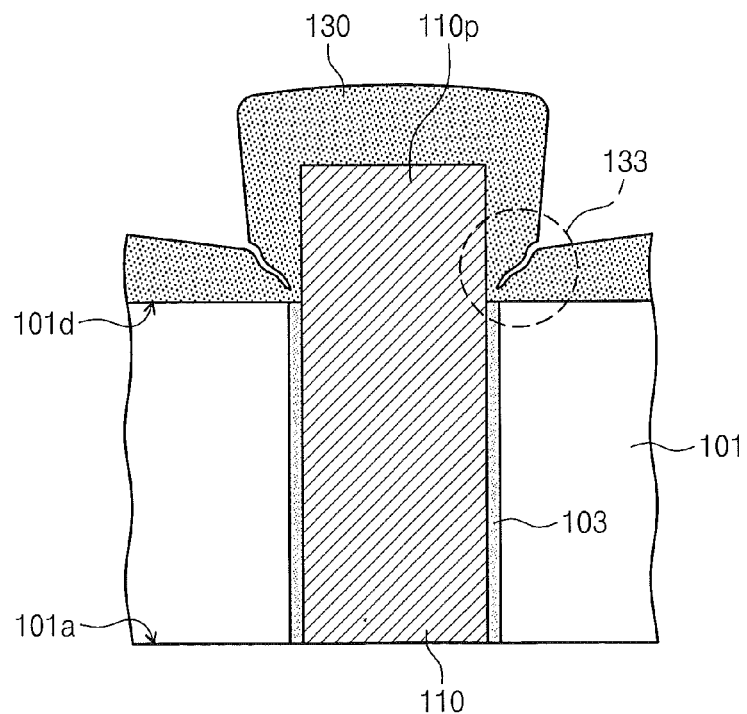

Referring to FIG. 5I, when the insulation layer 130 is formed in the case of no tail 120, unlike the method described above, defects may be generated, in which the insulation layer 130 is not properly formed at a folding portion 133 where the protruding portion 110p of the through electrode 110 and the flat lower surface 101d meet. When the insulation layer 130 covering the protruding portion 110p of the through electrode 110 in the foregoing state is removed by a subsequent grinding process, the insulation layer 130 may not properly support the protruding portion 110p of the through electrode 110. As a result, a failure phenomenon of the protruding portion 110p of the through electrode 110 may be generated by the stress applied to the through electrode 110 during the grinding process. However, according some embodiments described herein, since the insulation layer 130 may be formed to have an obtuse folding angle θ as illustrated in FIG. 5H, the insulation layer 130 may have an improved ability to support the protruding portion 110p of the through electrode 110. In addition, the protruding portion 110p of the through electrode 110 may be supported by the tail 120.

Figure 5J:
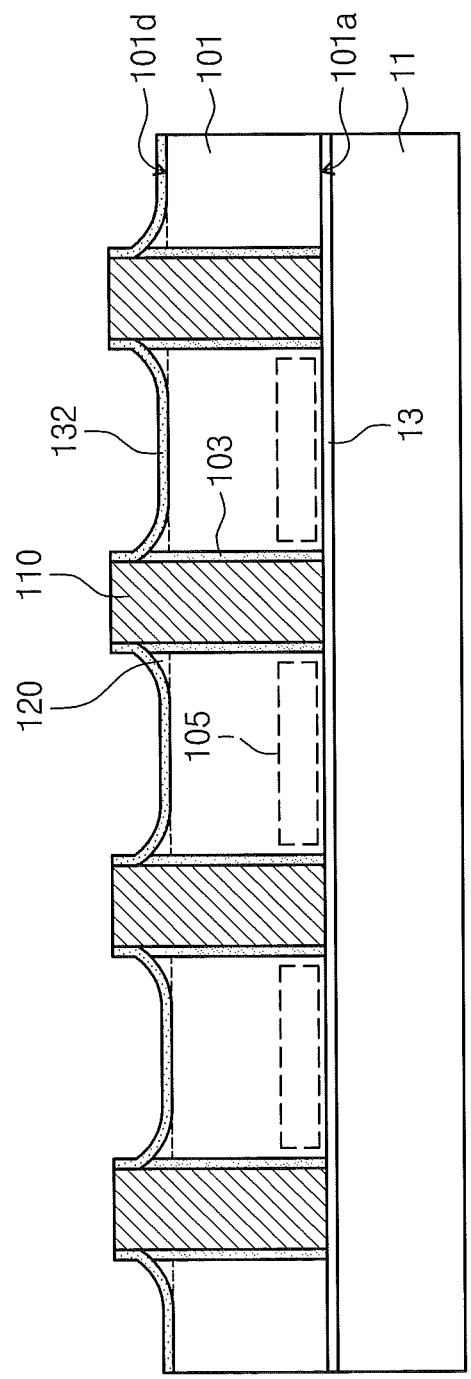

Referring to FIG. 5J, the insulation layer 130 may be patterned to form a protective layer 132 covering the lower surface 101d but opening the through electrode 110. The patterning of the insulation layer 130 may use a chemical mechanical polishing process, grinding, or etch back process. The protective layer 132 may be formed by chemical mechanical polishing or grinding the insulation layer 130. As described above with reference to FIGS. 5H and 5I, as the insulation layer 130 may be formed to have an obtuse folding angle θ during the protective layer 132 forming process, the failure phenomenon of the through electrode 110 may be eliminated or significantly reduced.

Figure 5K:
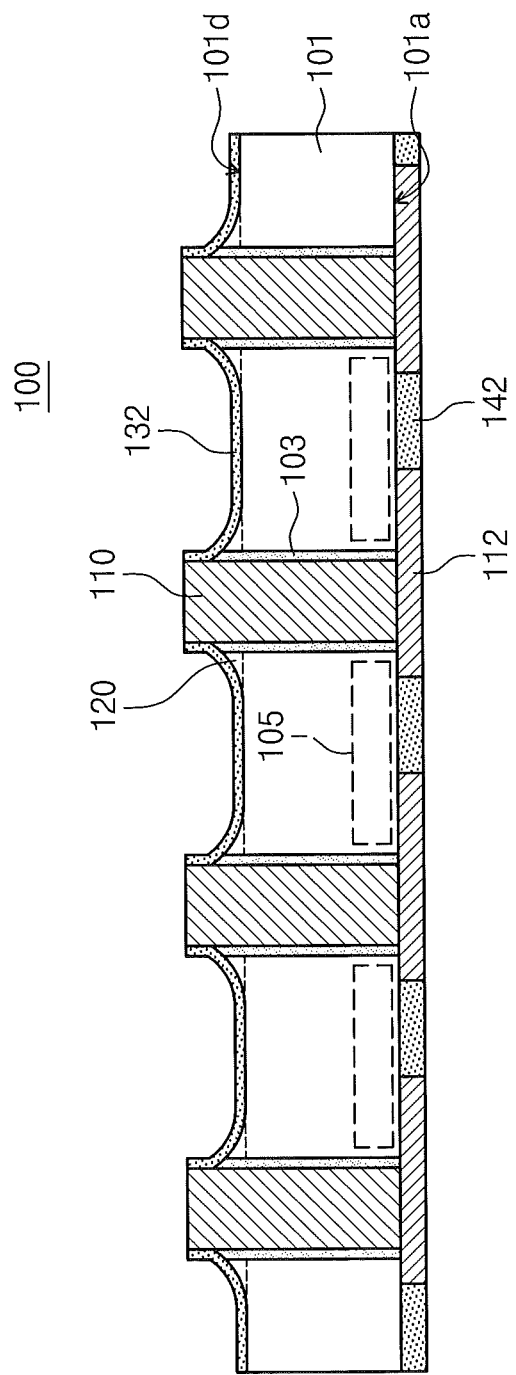

Referring to FIG. 5K, the carrier 11 and the adhesive layer 13 may be removed, and then metal interconnections 112 electrically connected to the through electrodes 110 may be formed on the upper surface 101a of the substrate 101. In addition, a protective layer 142 covering the upper surface 101a of the substrate 101 may be formed by depositing a silicon oxide layer, a silicon nitride layer, polymer (e.g., PEOX), or combinations thereof. The protective layer 142 may be formed in a configuration that opens the metal interconnections 112. Alternatively, the metal interconnections 112 and the protective layer 142 may be previously formed in the operation of FIG. 5A.

The metal interconnections 112 and the protective layer 142 are only examples that are not intended to limit the inventive concept thereto, and the structure formed on the upper surface 101a may be variously changed. For example, the through electrode 110 may protrude from the upper surface 101a or the through electrode 110 may be formed in a shape that is further extended like the metal interconnection 112. A semiconductor device 100 may be formed by the series of the foregoing process. When the substrate 101 is a wafer-level substrate, a sawing process, which separates the substrate 101 into individual chips, may be further performed.

<Example of Silicon Tail>

FIGS. 6A and 6B, FIGS. 7A and 7B, and FIGS. 8A and 8B are enlarged views illustrating portions in a method for fabricating a semiconductor device according to some embodiments of the inventive concept.

Figure 6A:
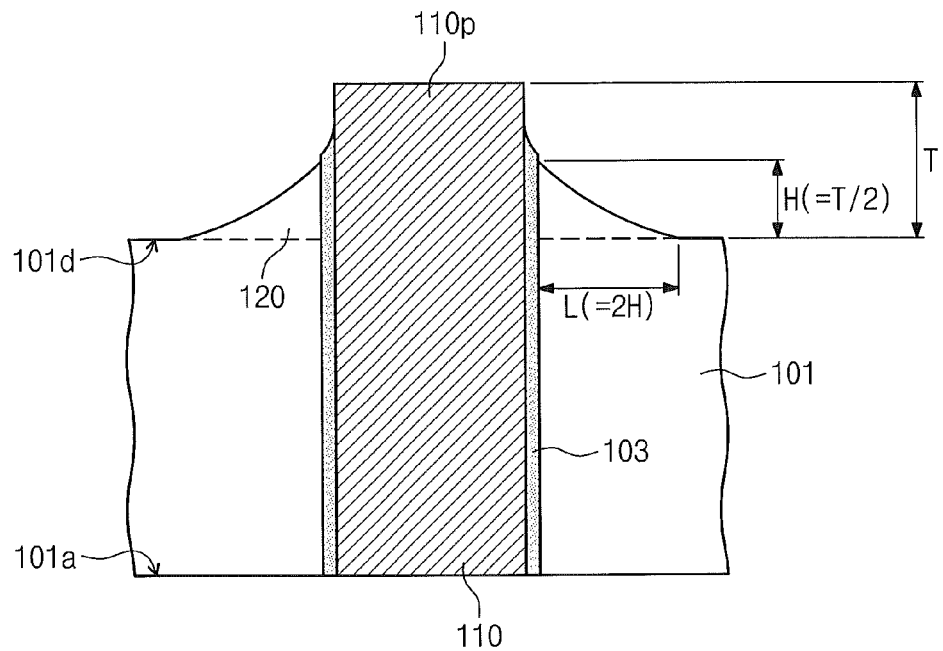
FIGS. 6A and 6B are enlarged cross-sectional views illustrating portions in a method of fabricating a semiconductor device according to some embodiments of the inventive concept.
Figure 6B:
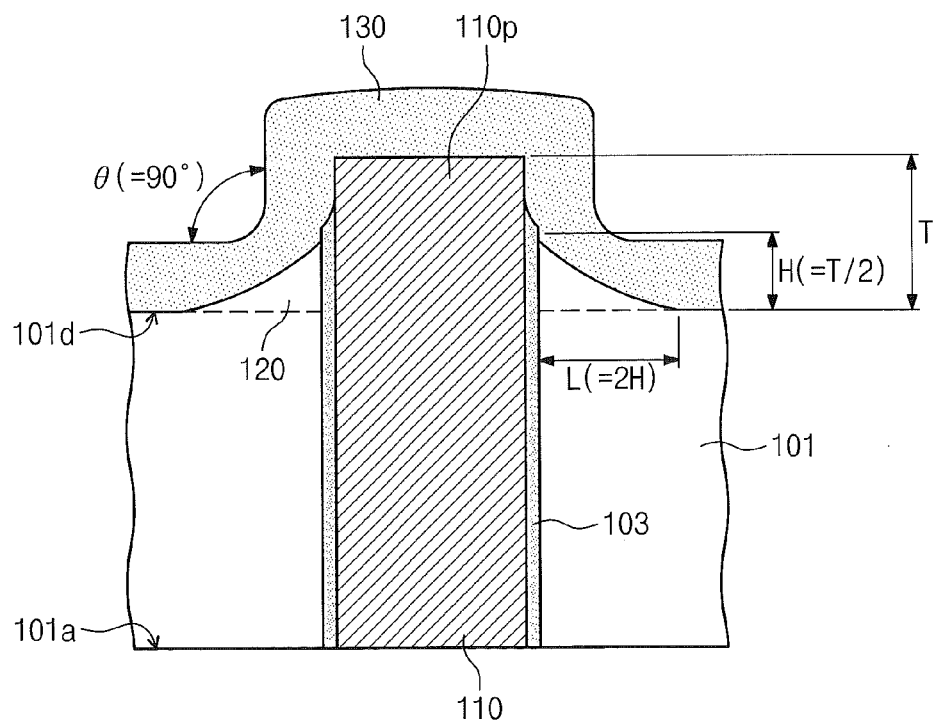

Referring to FIG. 6A, the tail 120 may be formed to have a configuration in which the height H is about ½ times of the protrusion height T of the protruding portion 110p and the length L of the base is about twice the height H. In this case, the insulation layer 130, as illustrated in FIG. 6B, may be formed to have the folding angle θ of generally about 90°. Process defects as described in FIG. 5I may be not generated during the forming of the insulation layer 130, and as a result, the insulation layer 130 may have the improved ability to support the protruding portion 110p of the through electrode 110.

Figure 7A:
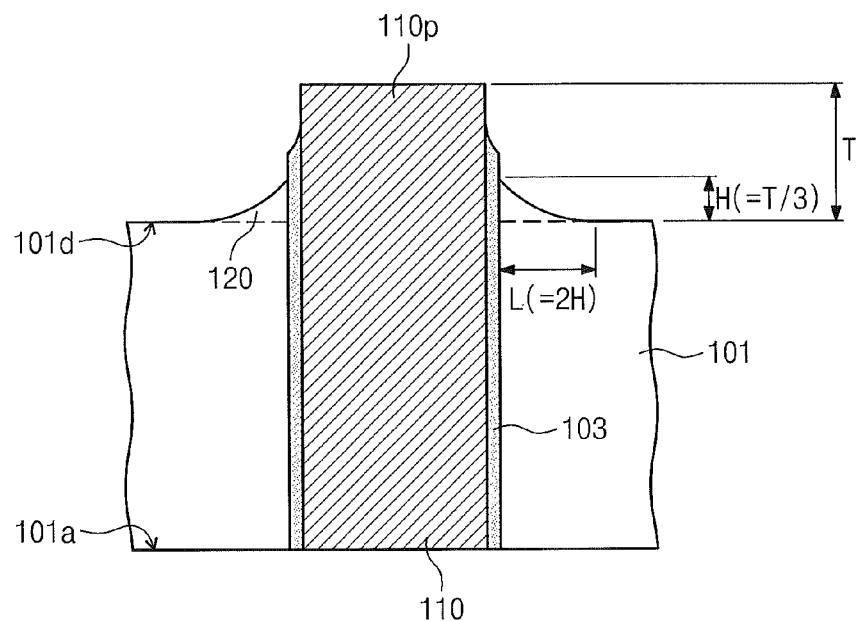
FIGS. 7A and 7B are enlarged cross-sectional views illustrating portions in a method of fabricating a semiconductor device according to some embodiments of the inventive concept.
Figure 7B:
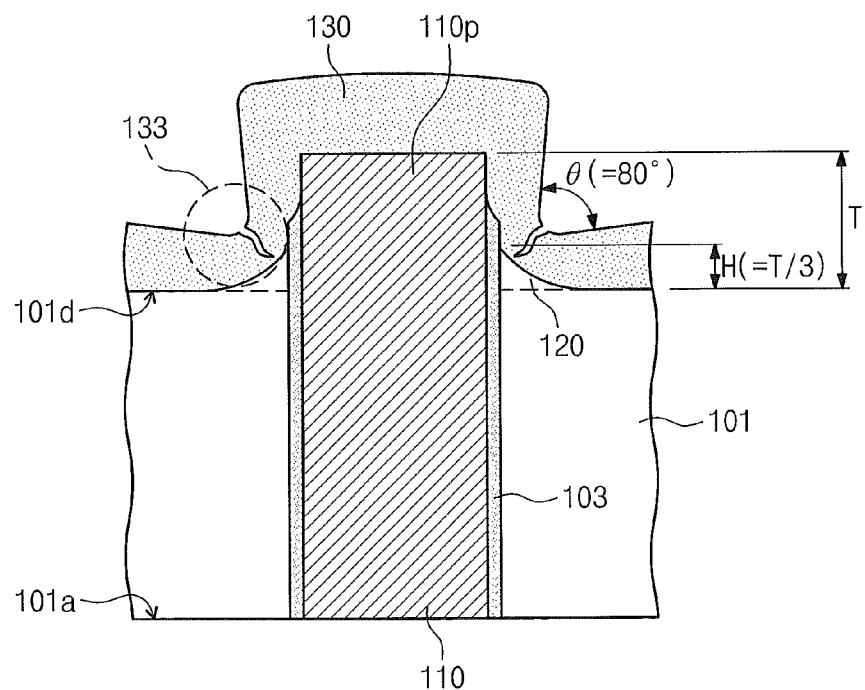

Referring to FIG. 7A, the tail 120 may be formed to have a configuration in which the height H is about ⅓ times of the protrusion height T of the protruding portion 110p and the length L of the base is about twice of the height H. In this case, the insulation layer 130, as illustrated in FIG. 7B, may be formed to have the folding angle θ of generally less than about 90°, e.g., about 80°. In the insulation layer 130 having the folding angle θ of less than about 90°, there may be a possibility to generate defects in which an insulating material is not properly deposited at the folding portions 133.

Figure 8A:
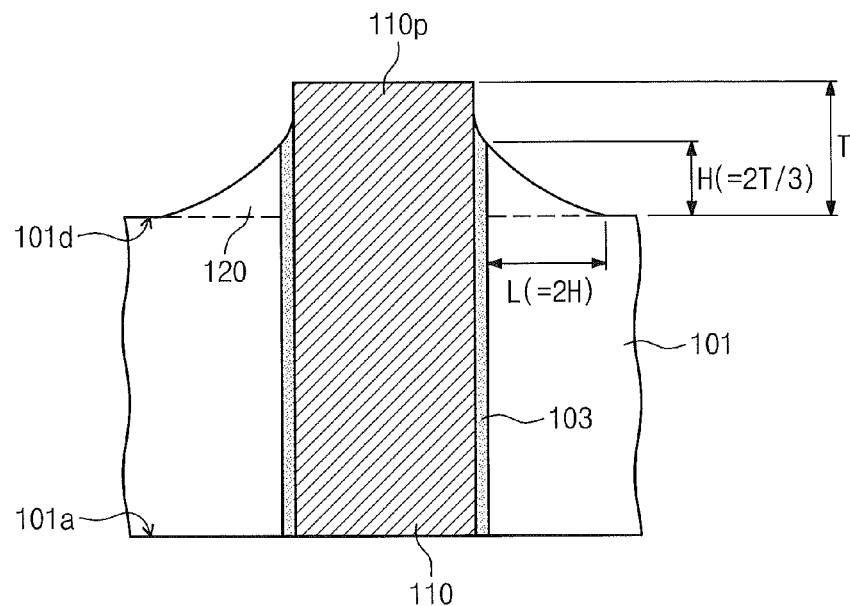
FIGS. 8A and 8B are enlarged cross-sectional views illustrating portions in a method of fabricating a semiconductor device according to some embodiments of the inventive concept.
Figure 8B:
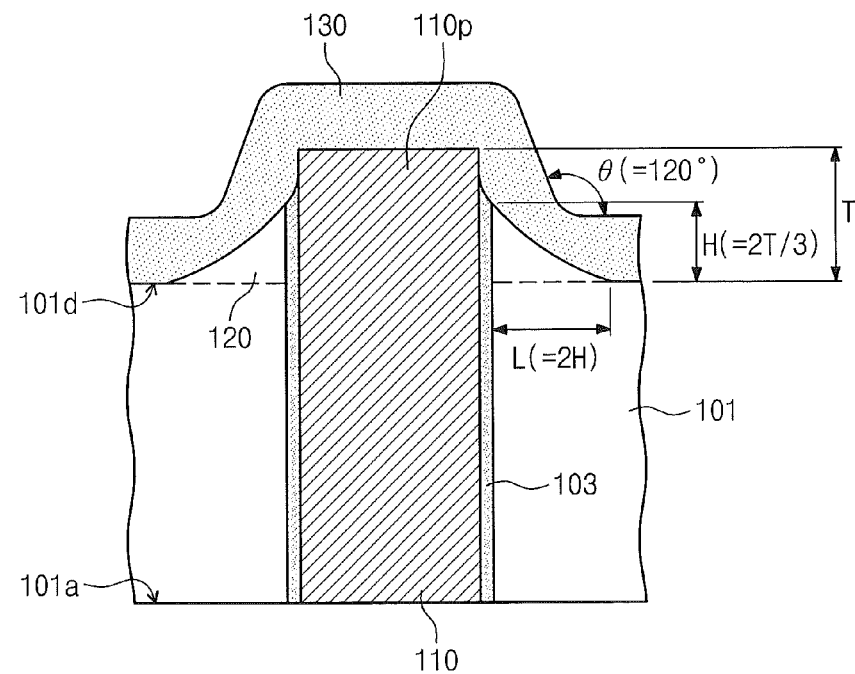

Referring to FIG. 8A, the tail 120 may be formed to have a configuration in which the height H is about ⅔ times of the protrusion height T of the protruding portion 110p and the length L of the base is about twice of the height H. In this case, the insulation layer 130, as illustrated in FIG. 8B, may be formed to have the folding angle θ of generally about 90° or more, e.g., about 120°. The insulation layer 130 having a very obtuse folding angle θ may be formed without defects.

Thus, when the base length L of the tail 120 is about twice of the height H, the tail 120 may be formed to have a configuration in which the height H of the protruding portion 110p is about ½ times or more of the height T in order to eliminate the defects of the insulation layer 130.

<Further Method Embodiments>

Figure 9A:
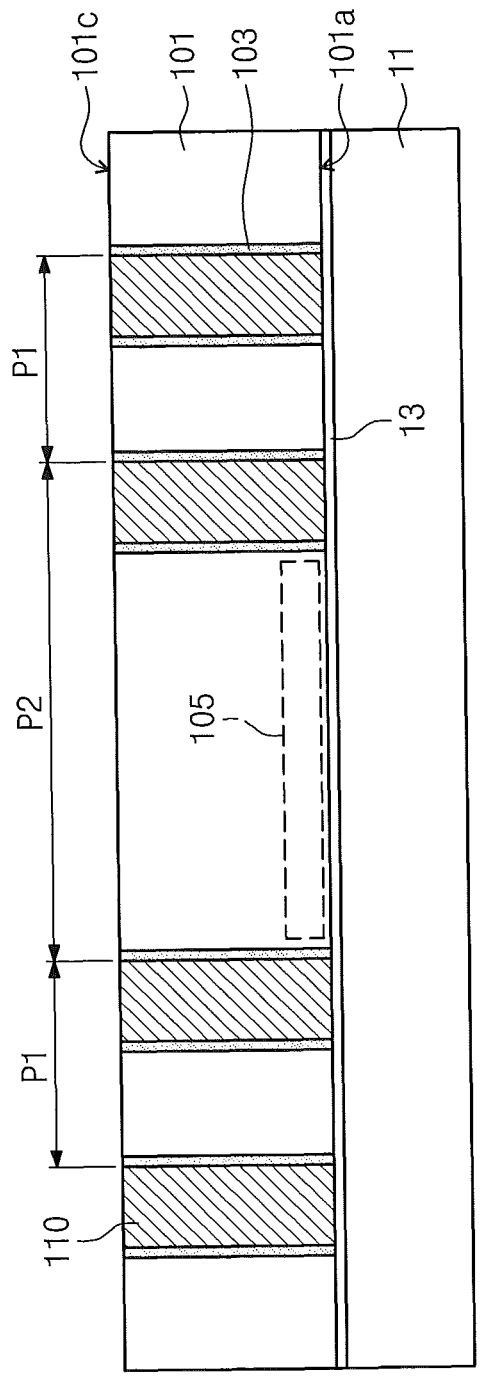
FIGS. 9A through 9C are cross-sectional views illustrating a method of fabricating a semiconductor device according to some embodiments of the inventive concept.
Figure 9B:
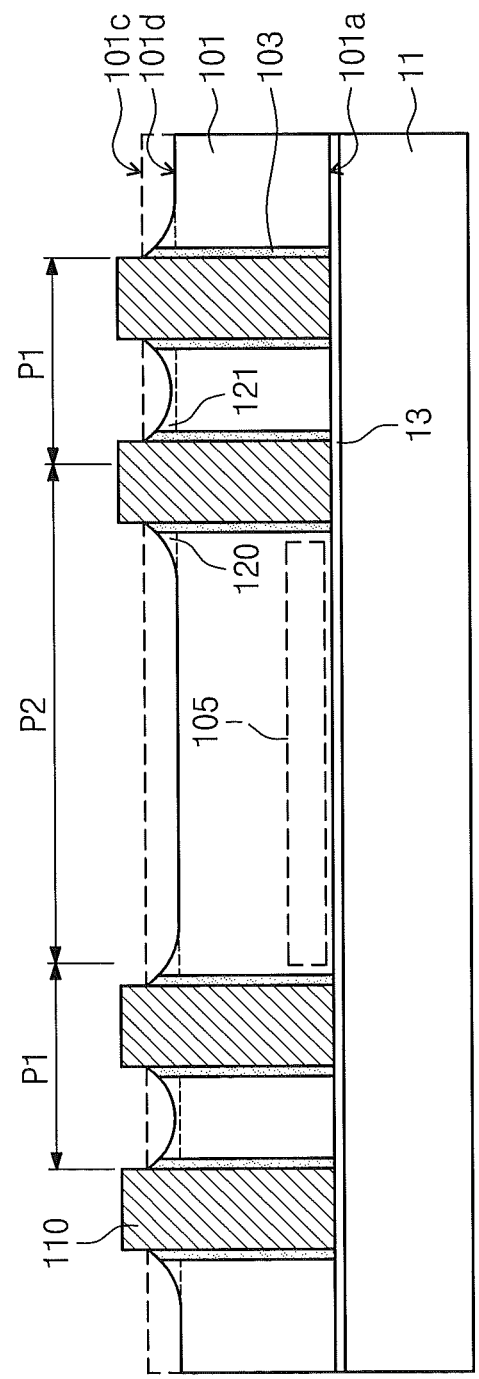
Figure 9C:
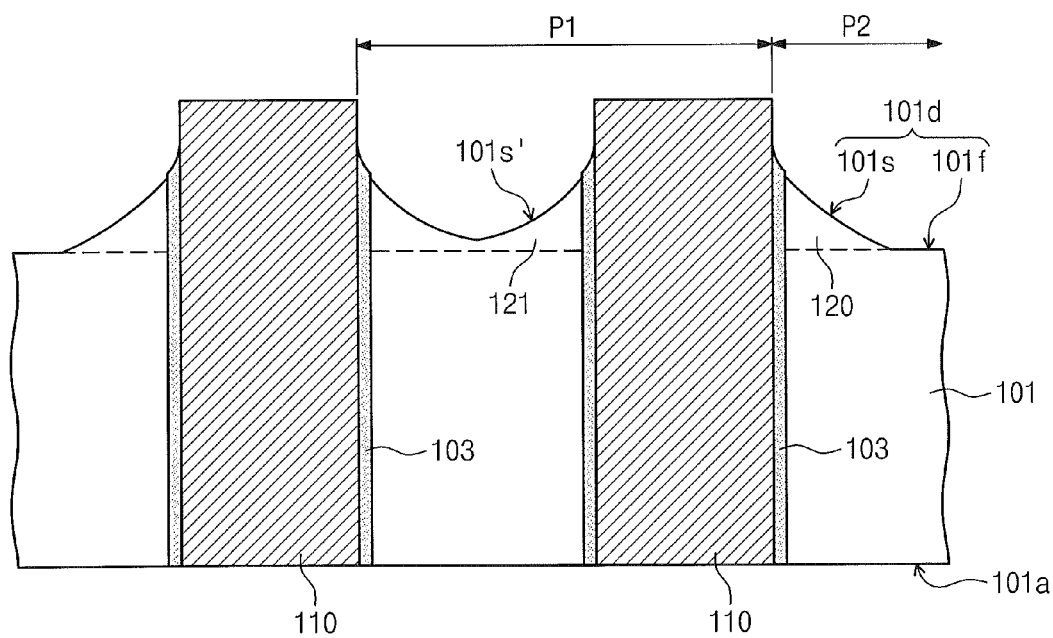

FIGS. 9A through 9C are cross-sectional views illustrating a method for fabricating a semiconductor device according to further embodiments of the inventive concept. FIG. 9C is an enlarged view of a portion of FIG. 9B.

Referring to FIG. 9A, the second lower surface 101 opening the through electrodes 110 may be formed through grinding the substrate 101 by the identical or similar processes described with reference to FIGS. 5A and 5C. The through electrodes 110 may be formed to have different pitches P1 and P2 from each other. For example, the through electrodes 110 may be formed to have first pitch P1 and second pitch P2 different from each other. The first pitch P1 may be smaller than the second pitch P2.

Referring to FIG. 9B, the third lower surface 101d protruding the through electrodes 110 may be formed through grinding the second lower surface 101c by the identical or similar process of FIG. 5D. The substrate 101 between the through electrodes 110 arranged at the first pitch P1 may be relatively ground less than the substrate 101 between the through electrodes 110 arranged at the second pitch P2 during the through electrode protruding process. As a result, asymmetrical tails 120 and 121 may be formed along the central through electrode 110. For example, the tail 120, which is formed between the through electrodes 110 adjacently formed to have the larger pitch P2, may be formed to have a configuration in which the inclined surface 101s has an upward slope from the flat surface 101f toward the through electrode 110 as illustrated in FIG. 5E. In contrast, the tail 121, which is formed between the through electrodes 110 adjacently formed to have the smaller pitch P1, may be formed to have a configuration in which an inclined surface 101s' is not in contact with the flat surface 101f as illustrated in FIG. 9C.

<Further Method Embodiments>

FIGS. 10A through 10D are cross-sectional views illustrating a method for fabricating a semiconductor device according to further embodiments of the inventive concept.

Figure 10A:
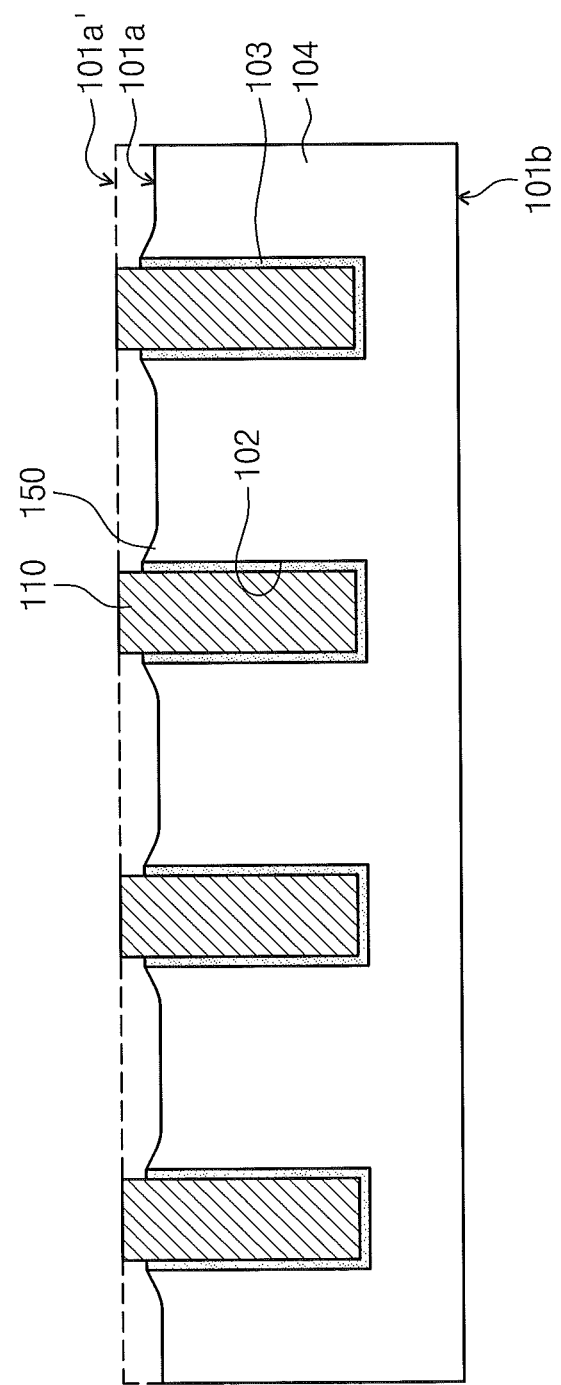
FIGS. 10A through 10D are cross-sectional views illustrating a method of fabricating a semiconductor device according to some embodiments of the inventive concept.

Referring to FIG. 10A, the through electrodes 110 may be formed in the bare substrate 104 and the upper surface 101a having the tail 150 may be formed by processing the bare substrate 104. For example, the upper surface 101a protruding the through electrodes 110 may be formed through grinding a top surface 101a' of the bare substrate 104 by a chemical mechanical polishing process. The through electrode 110 may be formed by a via first process. For example, the hole 102 may be previously formed in the bare substrate 104 such as a silicon wafer before a circuit pattern is formed. Then, the insulation layer 103 may be formed on an inner surface of the hole 102, and the through electrode 110 may be formed by filling the hole 102 with a conductor, e.g., copper.

Figure 10B:
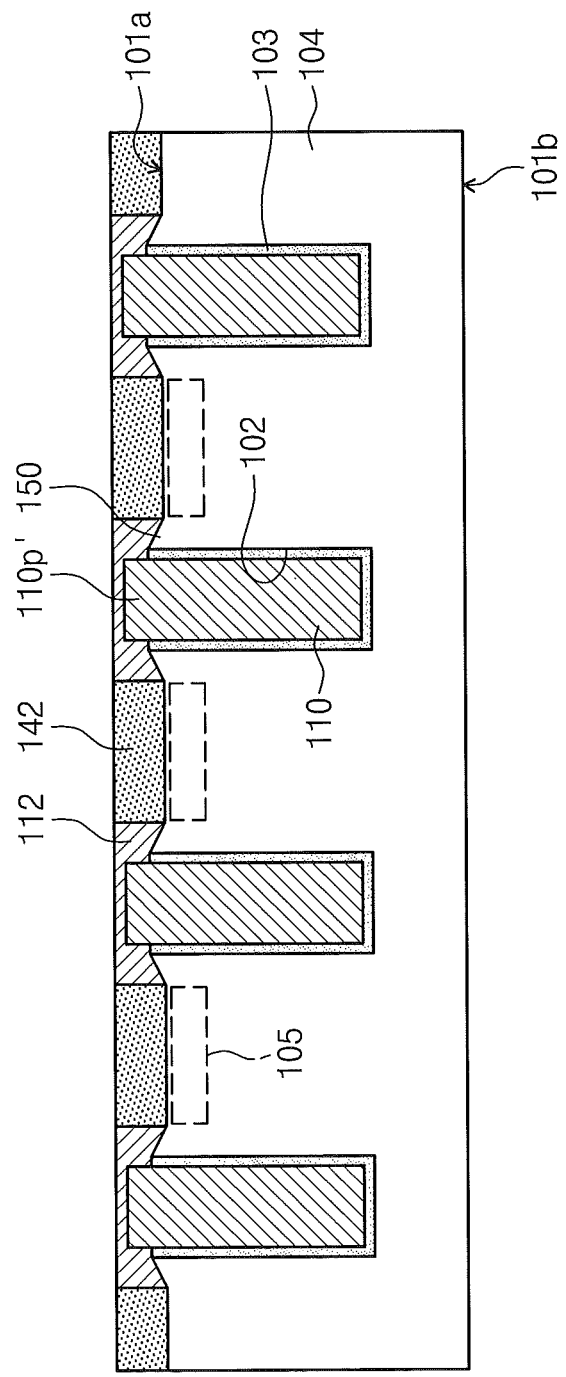

Referring to FIG. 10B, the circuit pattern 105 may be formed on the upper surface 101a, and the metal interconnection 112, which may electrically connect between the through electrode 110 and the circuit pattern 105, may be formed. An insulation layer may be interposed between the metal interconnection 112 and the upper surface 101a so that the metal interconnection 112 may be insulated from the bare substrate 104. The protective layer 142 covering the upper surface 101a may be formed after or before the forming of the metal interconnection 112. Stress may be applied to the through electrode 110 when the chemical mechanical polishing process is used during the forming of the metal interconnection 112 and/or the protective layer 142 or during a subsequent process. In this case, as the tail 150 supports the through electrode 110, particularly the protruding portion 110p' protruding from the upper surface 101a, failure of the through electrode 110 caused by the stress applied to the through electrode 110 may be limited or even prevented. The metal interconnections 112 and the protective layer 142 may be only examples that are absolutely not intended to limit the inventive concept thereto, and the metal interconnections 112 and the protective layer 142 may be formed on the upper surface 101a differing from the present embodiments. For example, the metal interconnections 112 and the protective layer 142 may be formed in a configuration that is identical or similar to the protective layer 132 and the metal bump 62 as illustrated in FIG. 3B.

Figure 10C:
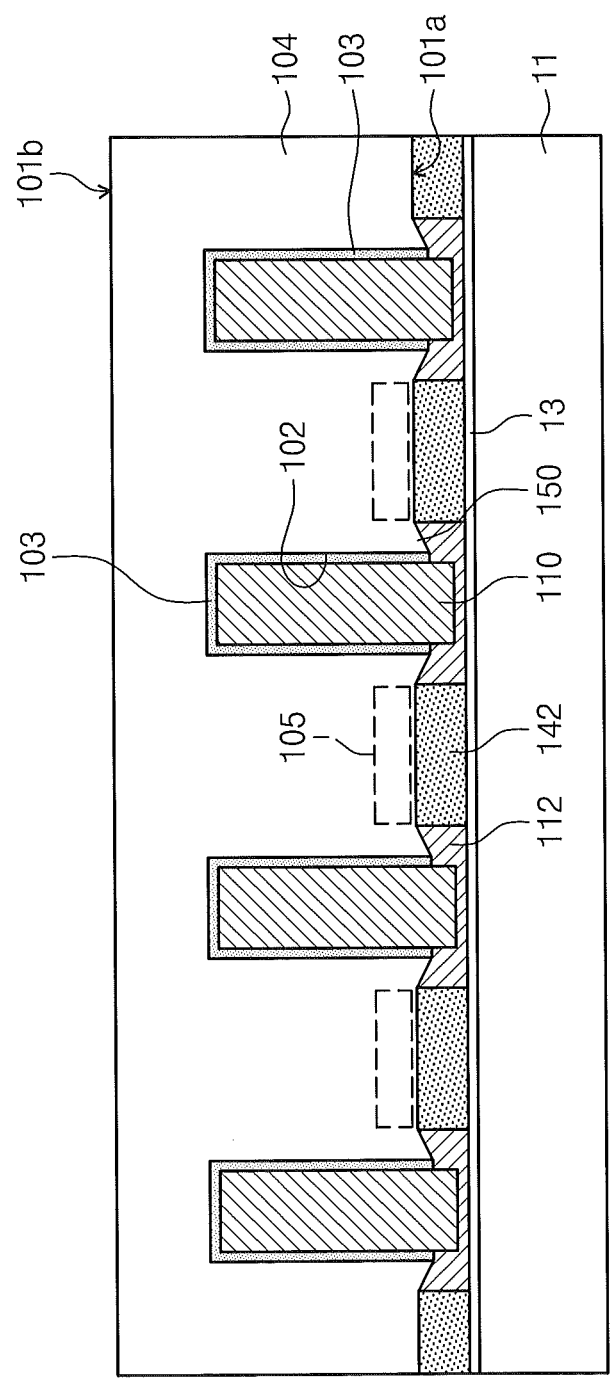
Figure 10D:
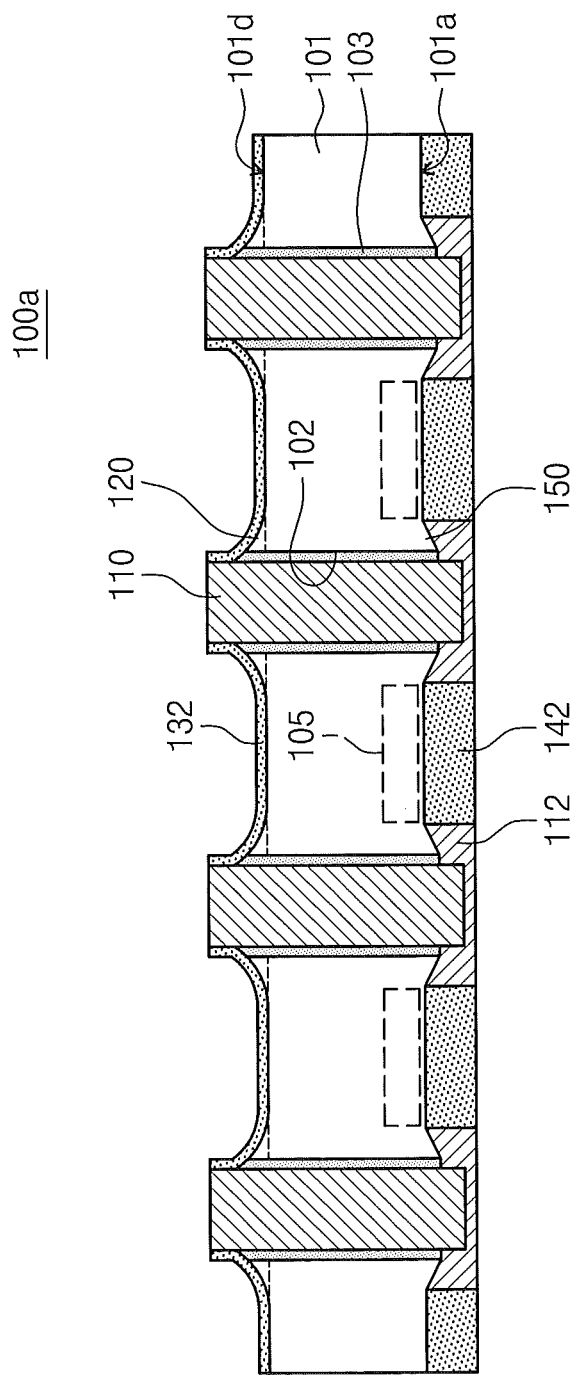

Referring to FIG. 10C, the bare substrate 104 may be placed on the carrier 11 with the adhesive layer 13 disposed therebetween by flipping the upper surface 101 of the bare substrate 104 to face the carrier 11. Then, if the identical or similar processes described in FIGS. 5C through 5K are performed, a semiconductor device 100a may be formed as illustrated in FIG. 10D, in which tails 150 and 120 are formed on the upper surface 101a and the lower surface 101d of the substrate 101, respectively.

<Further Device Embodiments>

Figure 11A:
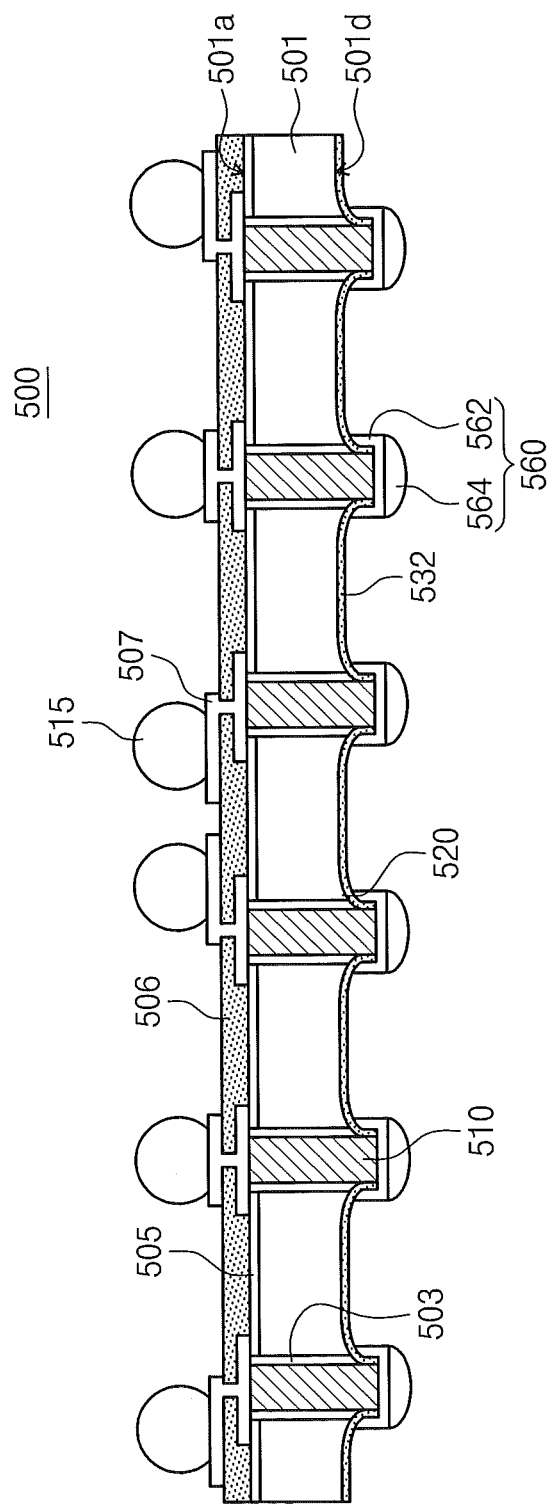
FIG. 11A is a cross-sectional view illustrating a semiconductor device according to some embodiments of the inventive concept.
Figure 11B:
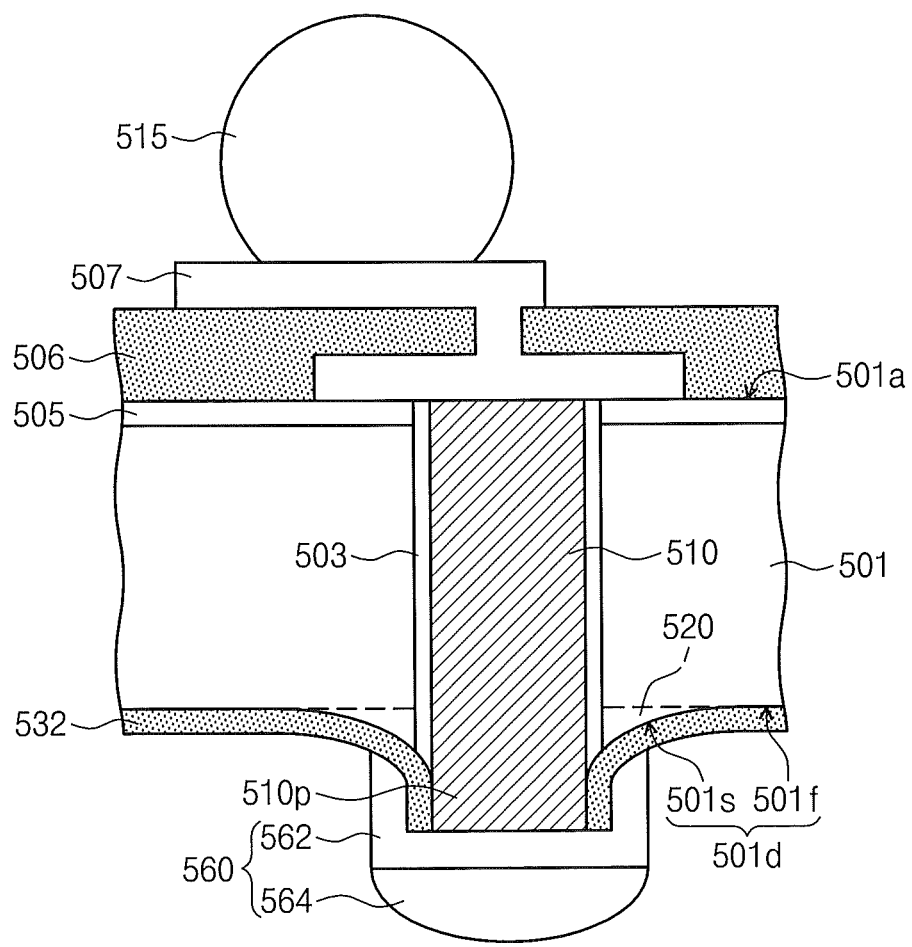
FIG. 11B is an enlarged view illustrating a portion of FIG. 11A.

FIG. 11A is a cross-sectional view illustrating a semiconductor device according to other embodiments of the inventive concept. FIG. 11B is an enlarged view illustrating a portion of FIG. 11A.

Referring to FIGS. 11A and 11B, a semiconductor device 500 may include a substrate 501 having a first surface 501a and a second surface 501d opposite to the first surface 501a, and a plurality of through electrodes 510 penetrating the substrate 501 each having a protruding portion 510p protruding from the second surface 501d. The semiconductor device 500 may further include a first terminal 515 connected to one end of the through electrode 510 and/or a second terminal 560 connected to the other end. The semiconductor device 500 may be an interposer which is an electrical connection medium inserted between electrical devices, for example, a printed circuit board and a semiconductor chip and/or semiconductor chips. As another example, the semiconductor device 500 may be a semiconductor chip including a circuit pattern. For simplicity of understanding, the first surface 501a denotes an upper surface and the second surface 501d denotes a lower surface, and the first terminal 515 denotes an upper terminal and the second terminal 560 denotes a lower terminal.

The semiconductor device 500 may include an upper protective layer 506 covering the upper surface 501a, a lower protective layer 532 covering the lower surface 501d, and an insulation layer 503 surrounding a side of the through electrode 510. The insulation layer 503 may insulate the through electrode 510 from the substrate 501. At least any one of the upper and lower terminals 515 and 560 may be aligned or not aligned with the through electrode 510. For example, the upper terminal 515 may be not aligned with the through electrode 510, but the lower terminal 560 may be aligned with the through electrode 510. The semiconductor device 500 may include a redistributed metal interconnection 507 in order to connect the through electrode 510 and the upper terminal 515 which are not aligned to each other. The semiconductor device 500 may include an insulation layer 505 to insulate the redistributed metal interconnection 507 from the substrate 501. The upper terminal 515 may include a solder ball. The lower terminal 560 may include a metal bump 562 surrounding the protruding portion 510p of the through electrode 510 and a solder 564 prepared on the metal bump 562 to reinforce adhesive strength.

As illustrated in FIG. 11B, the lower surface 501d may have a flat surface 501f and an inclined surface 501s. The inclined surface 501s may have an upward slope from the flat surface 501f toward the through electrode 510. According to the configuration of the lower surface 501d, the substrate 501 may include a tail 520 having a configuration surrounding the protruding portion 510p of the through electrode 510, e.g., generally a conical shape. The tail 520 may support the through electrode 510 such that the through electrode 510 does not fall down when the stress is applied to the through electrode 110. The tail 520 may be formed of the same material as the substrate 501, for example, silicon (Si).

<Other Device Embodiments>

Figure 12A:
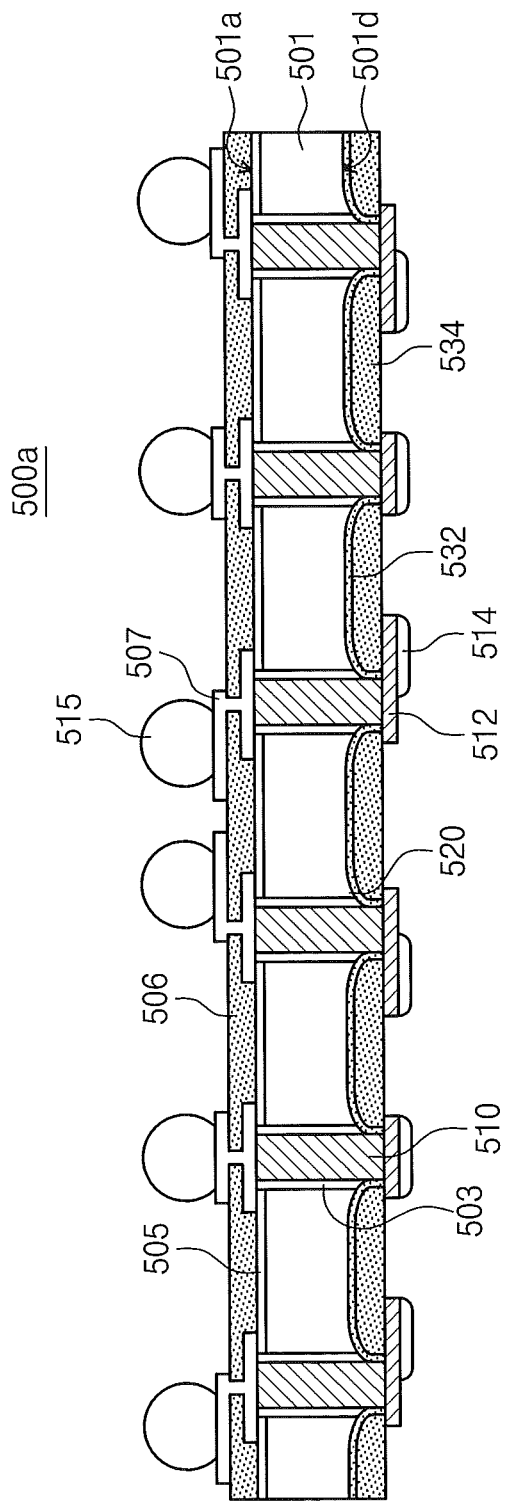
FIG. 12A is a cross-sectional view illustrating a semiconductor device according to some embodiments of the inventive concept.
Figure 12B:
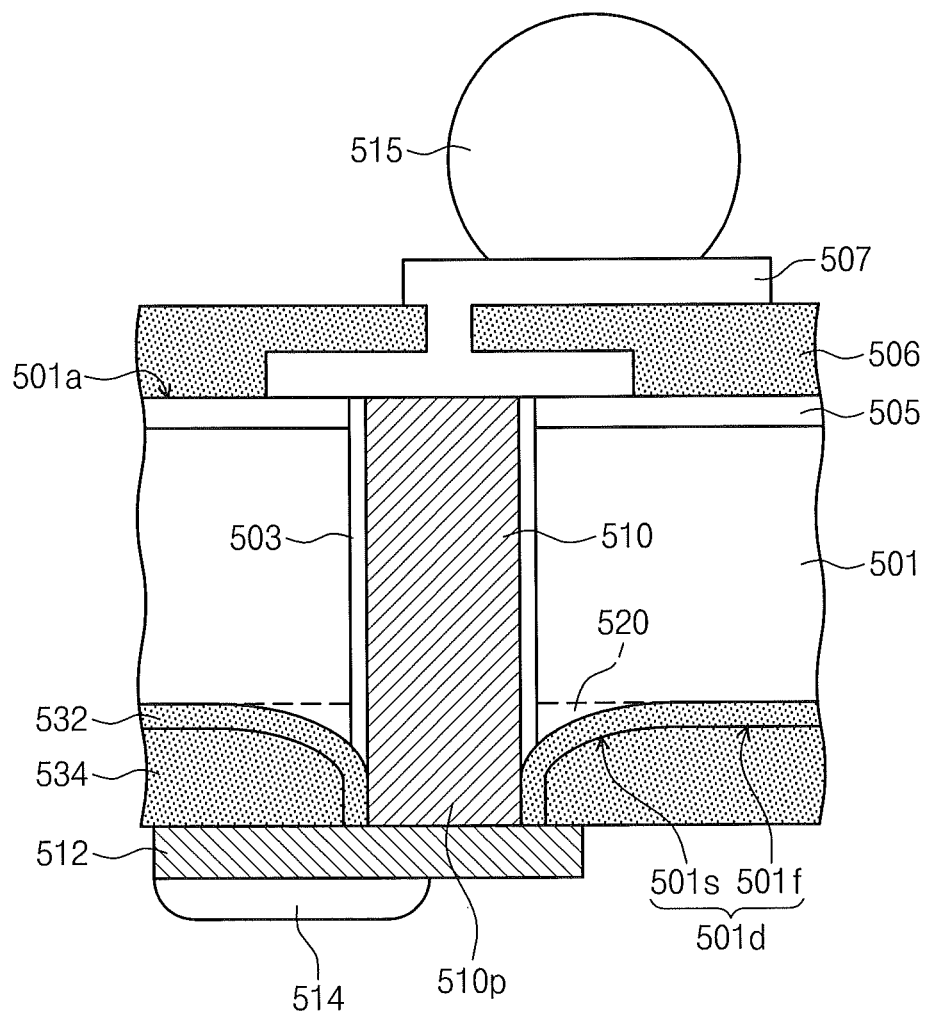
FIG. 12B is an enlarged view illustrating a portion of FIG. 12A.

FIG. 12A is a cross-sectional view illustrating a semiconductor device according to other embodiments of the inventive concept. FIG. 12B is an enlarged view illustrating a portion of FIG. 12A.

Referring to FIGS. 12A and 12B, a semiconductor device 500a may include the substrate 501 in which the tail 520 is included on the lower surface 501d and the through electrode 510 is formed therein as identical or similar to the semiconductor device 500 of FIGS. 11A and 11B. The redistributed metal interconnection 507 connected to the through electrode 510 and the upper terminal 515 connected to the metal interconnection 507 may be provided on the upper surface 501a of the substrate 501. The semiconductor device 500a may further include a lower insulation layer 534 flat covering the lower surface 501d of the substrate 501 having a recessed shape, a redistributed metal interconnection 512 connected to the protruding portion 510p of the through electrode 510 on the lower insulation layer 534, and a lower terminal 514 connected to the metal interconnection 512. The lower terminal 514 may have various shapes such as a metal bump or a solder ball, etc.

<Other Method Embodiments>

Figure 13A:
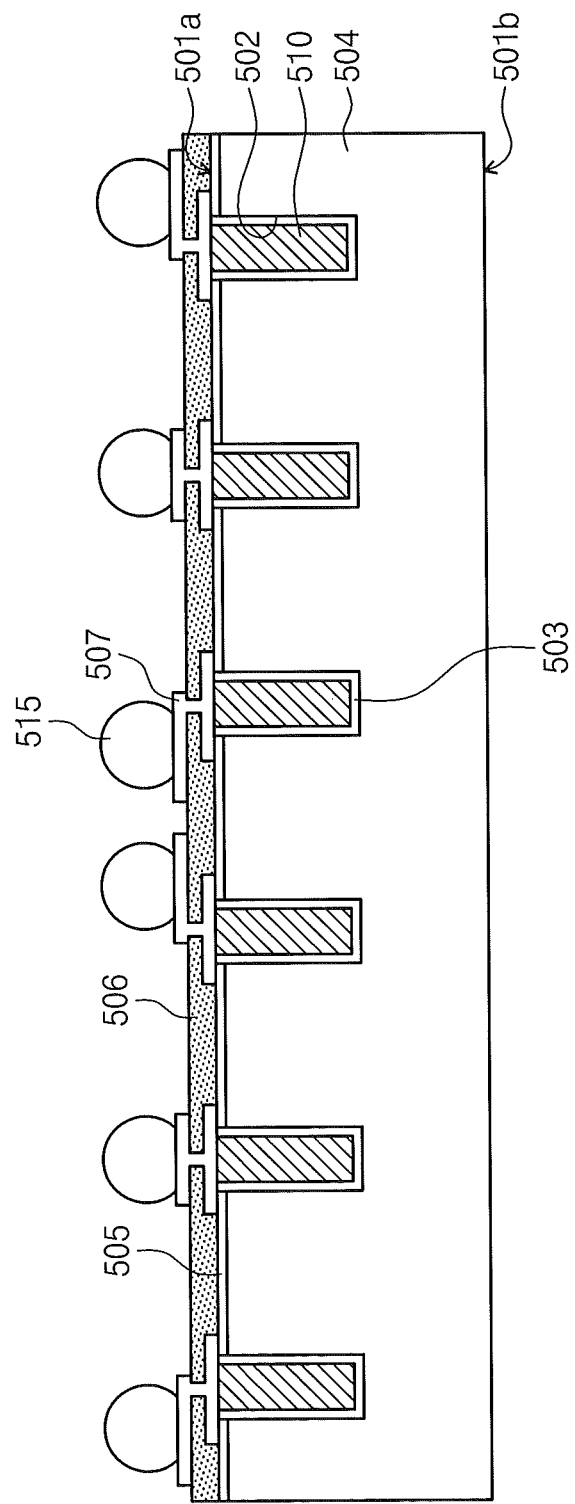
Figure 13C:
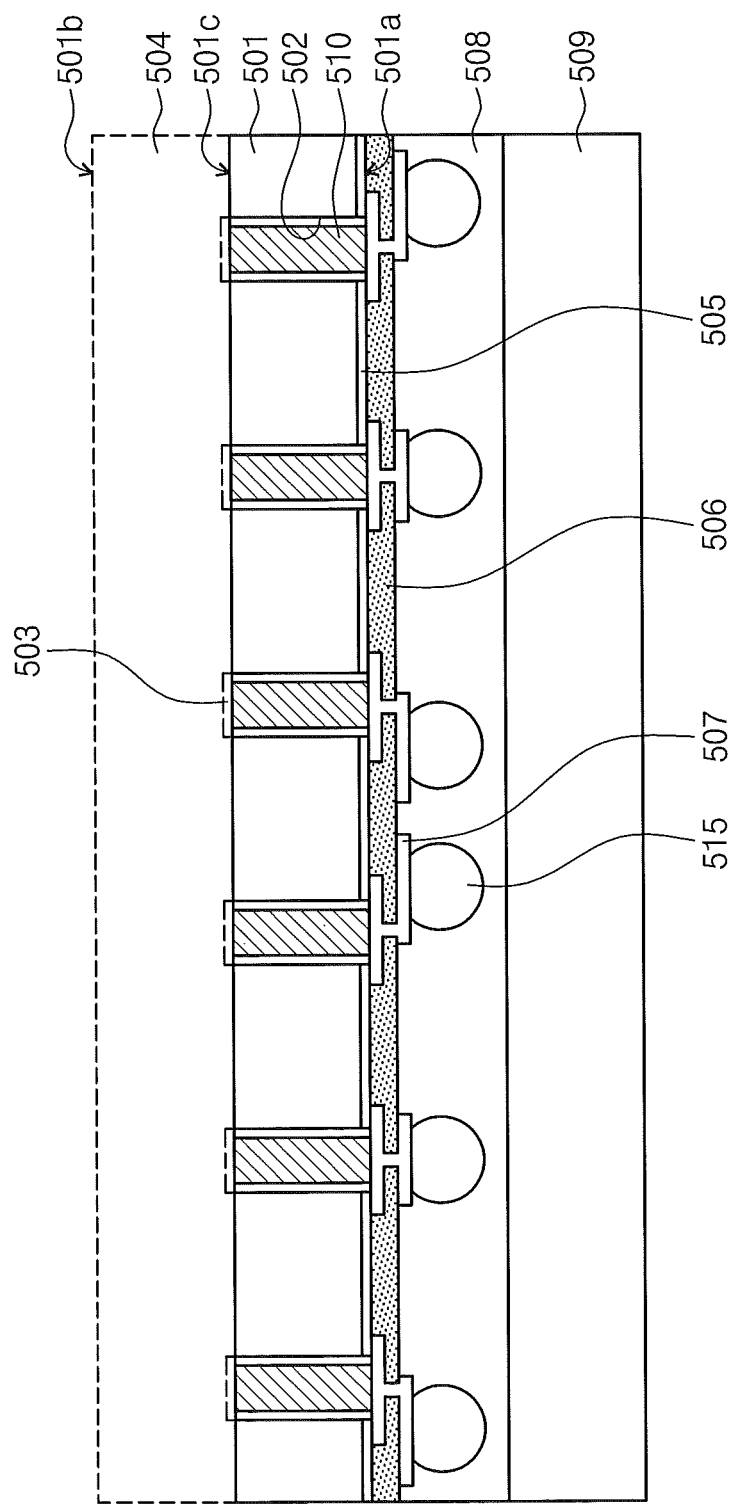
Figure 13D:
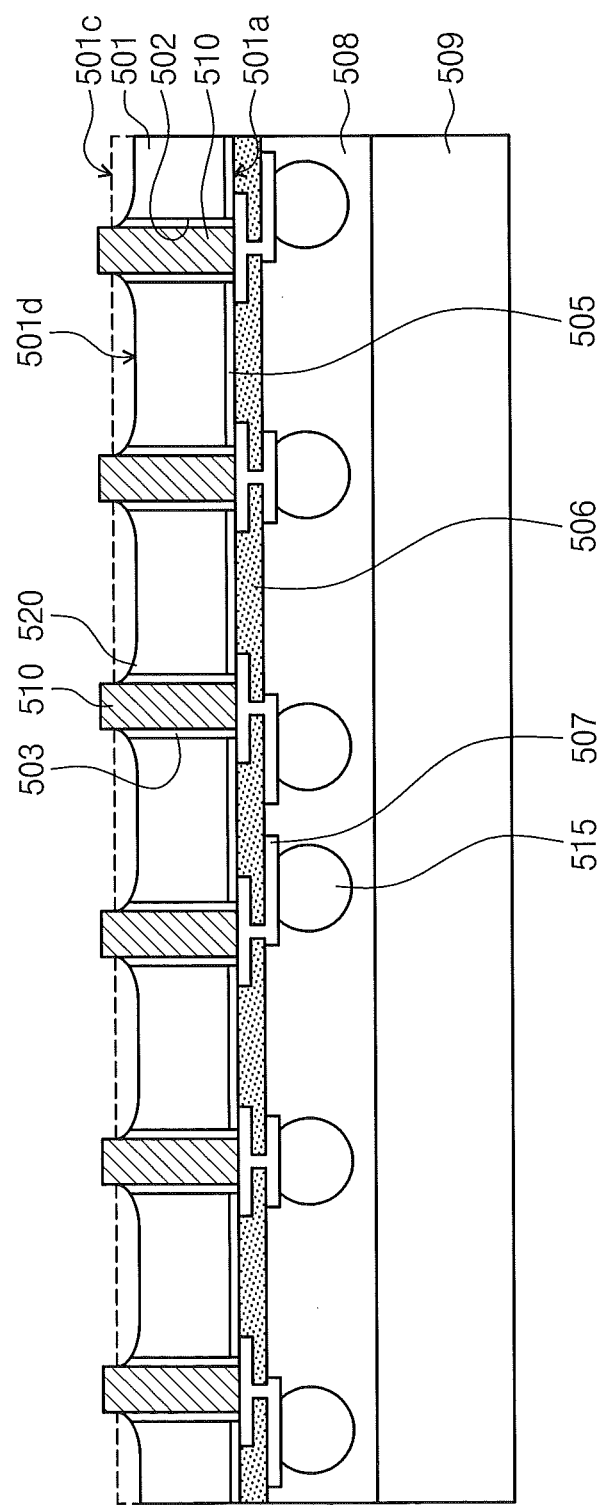
Figure 13E:
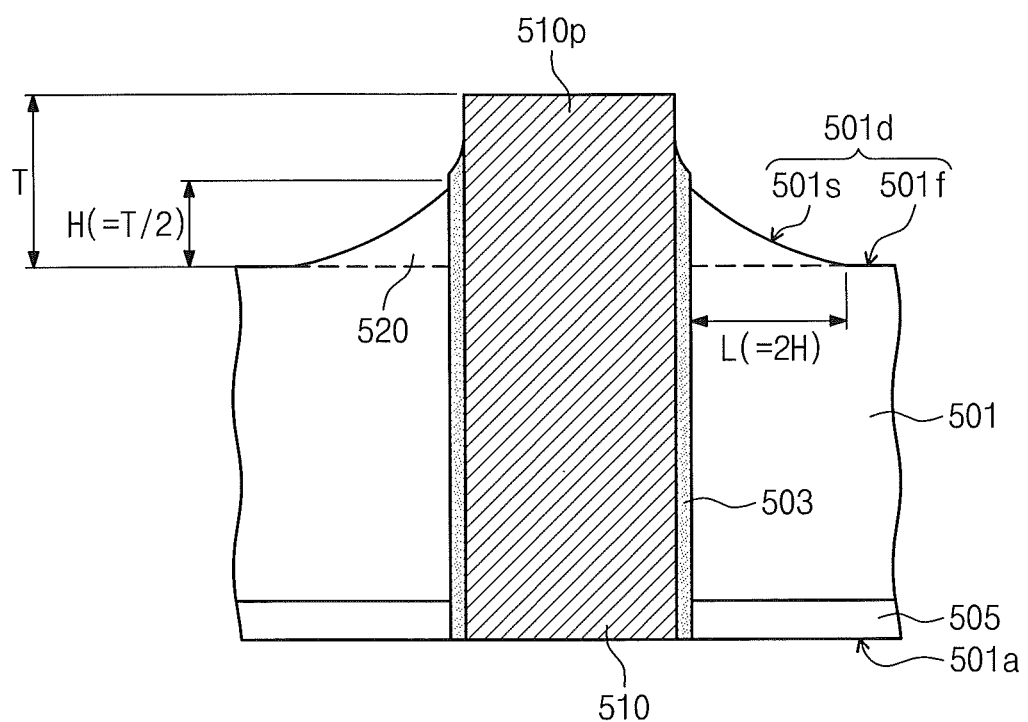
Figure 13F:
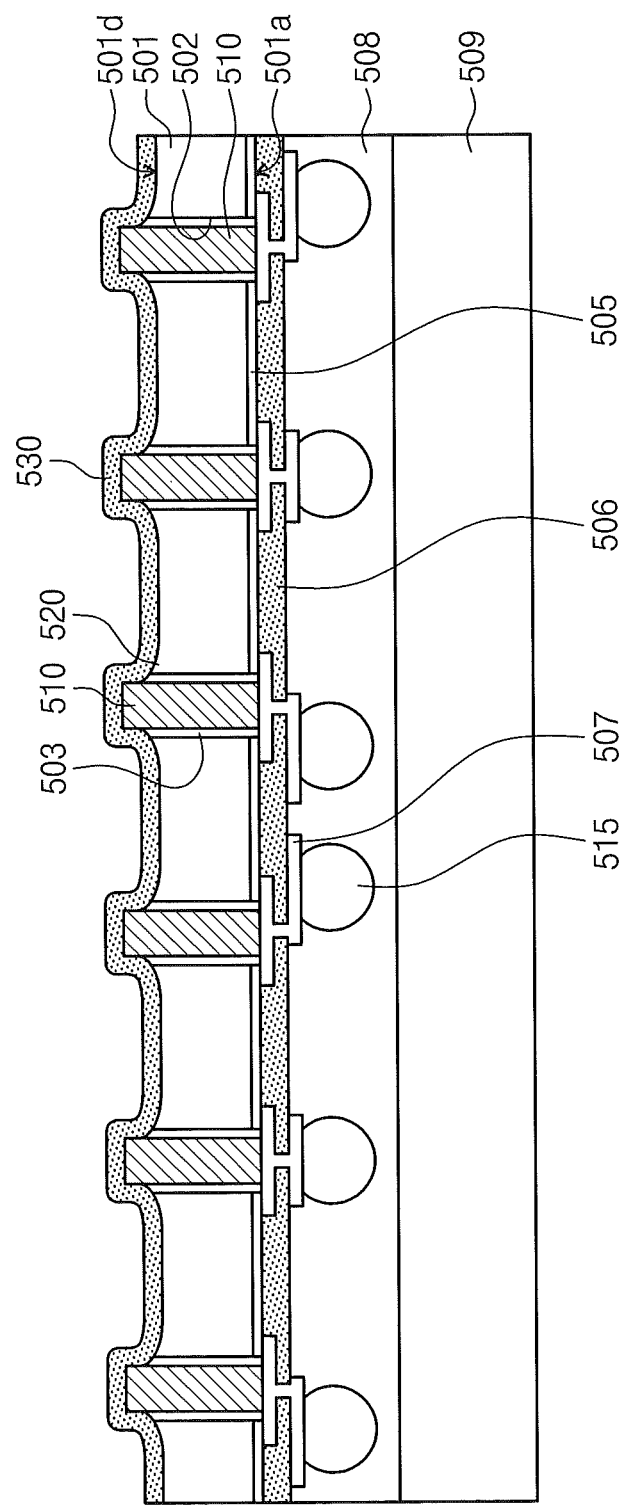
Figure 13G:
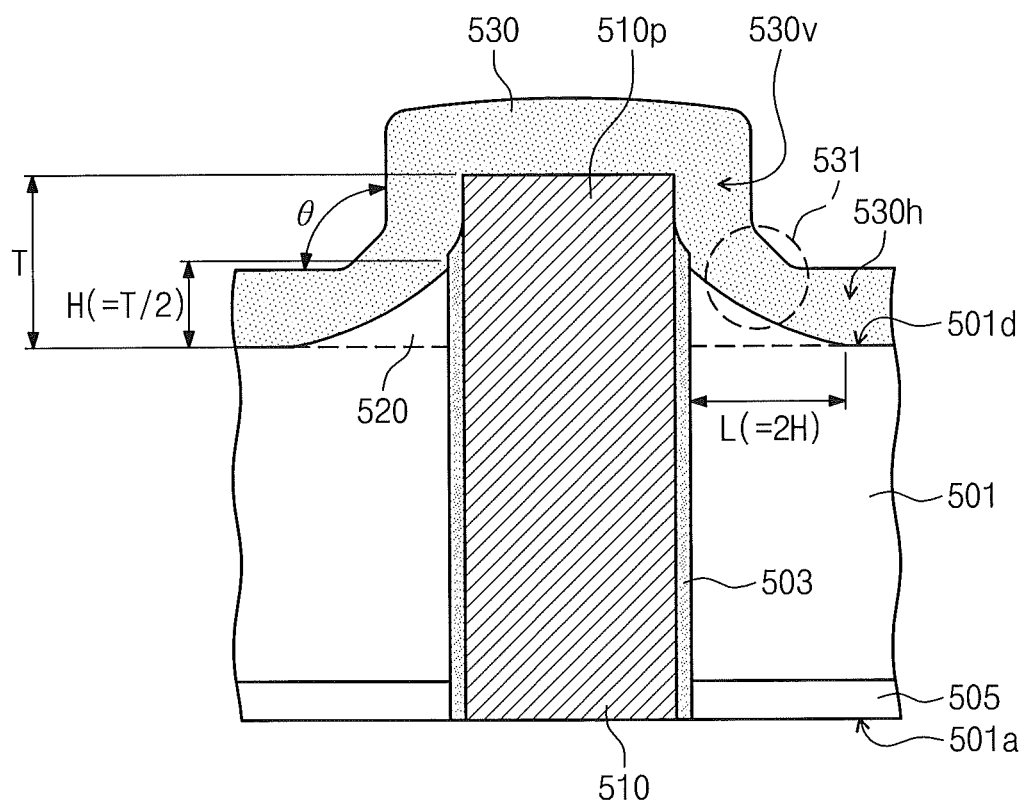

FIGS. 13A through 13K are cross-sectional views illustrating a method for fabricating a semiconductor package including a semiconductor device according to other embodiments of the inventive concept. FIGS. 13E and 13G are enlarged views of portions of FIGS. 13D and 13F, respectively.

Referring to FIG. 13A, a bare substrate 504 may be provided. The bare substrate 504 may include an upper surface 501a and a first lower surface 501b opposite to the upper surface 501a, and a through electrode 510 electrically connected to an upper terminal 515. The bare substrate 504 may be a wafer-level silicon substrate or a silicon-on-insulator (SOI) substrate. The bare substrate 104 may further include an insulation layer 505 which is formed in order to electrically insulate from a metal interconnection 507. The through electrode 510 may be formed by filling a conductor such as polysilicon or copper in a hole 502 formed through etching the bare substrate 504. The hole 502 may be formed to a depth which extends toward the first lower surface 501b but does not reach the first lower surface 501b. An insulation layer 503 may be formed in the hole 502 by depositing an insulator to electrically insulate between the bare substrate 504 and the through electrode 510, e.g., a silicon oxide layer or a silicon nitride layer.

The upper terminal 515 connected to the through electrode 510 may be formed on the upper surface 501a of the bare substrate 504. The upper terminal 515 may include a solder ball. The upper terminal 515 may be aligned or not aligned with the through electrode 510. A redistributed metal interconnection 507 may be formed to connect the through electrode 510 and the upper terminal 515 which are not aligned to each other. The metal interconnection 507 may be formed as a single layer structure or a multilayer structure. Before the forming of the upper terminal 515, an upper protective layer 506 covering the upper surface 501a of the bare substrate 504 may be formed.

Referring to FIG. 13B, a carrier 509 may be attached to the bare substrate 504. For example, the carrier 509 may be attached to the upper surface 501a of the bare substrate 504 by disposing an adhesive layer 508 therebetween. In order to prevent the damage of the upper terminal 515 possibly caused by contacting between the carrier 504 and the upper terminal 515, the adhesive layer 508 may have a thickness sufficiently surrounding the upper terminal 515. The carrier 509 may be composed of glass, polymer, or a material similar thereto. The carrier 509 may support the bare substrate 504 and may protect the upper surface 501a from grinding damage or contamination. Hereinafter, the bare substrate 504 in a flipped state will be described for the simplicity of the description.

Referring to FIG. 13C, the through electrode 510 may be opened by thinning the bare substrate 504. For example, a substrate 501, which has a second lower surface 501c exposing the through electrodes 510 and has a thickness thinner than the bare substrate 504, may be formed through grinding the first lower surface 501b of the bare substrate 504 by chemical mechanical polishing (CMP), grinding, or an etch back process. A portion of the insulation layer 503 may be removed during the through electrode open process.

Referring to FIG. 13D, a third lower surface 501d (hereinafter, referred to as the "lower surface"), which may protrude the through electrode 510 and has a level closer to the upper surface 501a than the second lower surface 501c, may be formed by grinding the second lower surface 501c of the substrate 501. The through electrode protruding process may be performed by chemical mechanical polishing, grinding, or etch back, etc. For example, as identical or similar to the description of FIG. 5D, the through electrode protruding process may be performed by a chemical mechanical polishing process using a slurry including water ($H_2O$), abrasive particles (e.g., $SiO_2$), and an additive (e.g., an amine-based compound). Therefore, as illustrated in FIG. 13E, a tail 520 may be formed on the substrate 501 and the through electrode 510 may have a protruding portion 510p protruding from the lower surface 501d.

Referring to FIG. 13E, the lower surface 501d may have a flat surface 501f and an inclined surface 501s, and the inclined surface 501s may have an upward slope toward the through electrode 510. Therefore, a conically-shaped tail 520 having a generally vertical cross-section of a right triangle, which is adjacent to the through electrode 510 and surrounds the protruding portion 501p of the through electrode 510, may be formed on the lower surface 501d of the substrate 501. According to the through electrode protruding process using the chemical mechanical polishing process, the tail 520 may be formed to have a configuration in which the height H is about ½ times or more of the protrusion height T of the protruding portion 110p and the length L of the base is about twice of the height H. The tail 520 may limit or even eliminate deposition defects of the insulation layer (see 530 of FIG. 13G) and may improve the ability to support the protruding portion 510p as described below. The insulation layer 503 may be recessed by grinding together with the substrate 501 during the chemical mechanical polishing process.

Referring to FIG. 13F, an insulation layer 530 may be formed to have a thickness enough to cover the through electrode 510 on the lower surface 501d of the substrate 501 by depositing a silicon oxide layer, a silicon nitride layer, polymer (e.g., polyethylene oxide), or combinations thereof. The shape of the insulation layer 530 may be changed according to the shape of the tail 120, and this has been already described in FIGS. 6A and 6B, 7A and 7B, and 8A and 8B. When the tail 520 has a configuration like in FIG. 13E, the insulation layer 530 may be formed in a shape like in FIG. 13G.

Referring to FIG. 13G, when the tail 520 has a configuration in which the height H is about ½ times or more of the protrusion height T of the protruding portion 510p and the length L of the base is about twice of the height H, the insulation layer 530 may be formed to have an obtuse folding angle θ between a horizontal component 530h and a vertical component 530v of generally about 90° or more. In other words, deposition defects of an insulating material is not generated at a folding portion 531, and the insulation layer 530 may have an improved ability to support the protruding portion 510p during a subsequent grinding process.

Figure 13H:
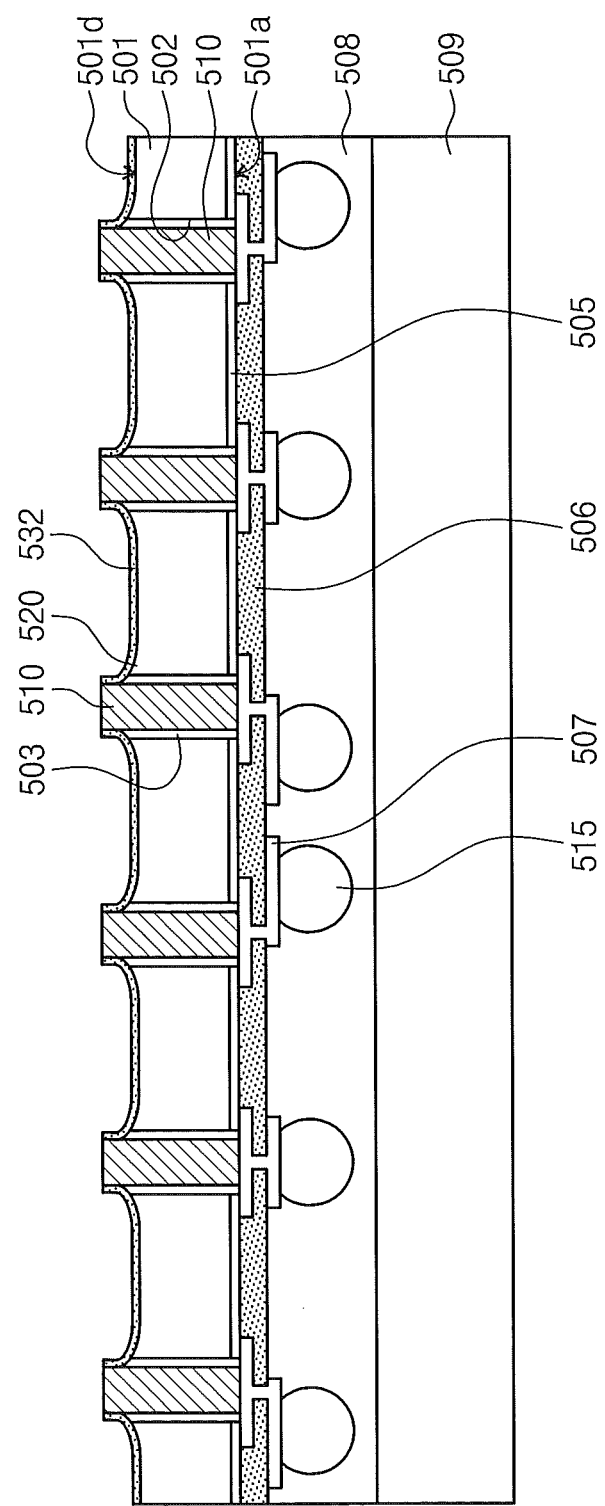

Referring to FIG. 13H, a lower protective layer 532 covering the lower surface 510d may be formed through patterning the insulation layer 530 by a chemical mechanical polishing process or a grinding process. The lower protective layer 532 may open the through electrode 510. During the forming of the lower protective layer 532 as described in FIG. 13G, since the insulation layer 530 has an obtuse folding angle θ, a failure phenomenon of the through electrode 510 possibly caused by the grinding process may be eliminated or significantly reduced.

Figure 13I:
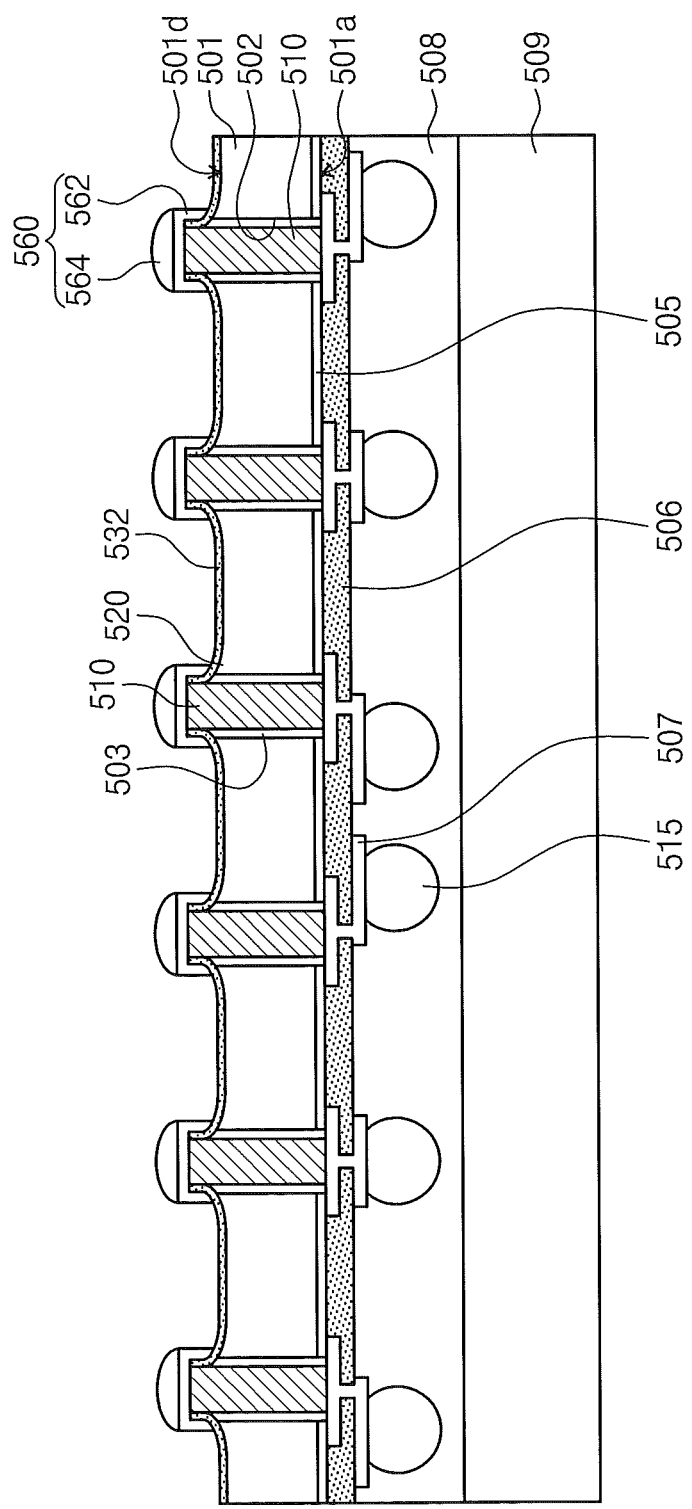

Referring to FIG. 13I, a lower terminal 560 connected to the through electrode 510 may be formed on the lower surface 501d of the substrate 501. For example, the lower terminal 560 may be formed by forming a metal bump 562 surrounding the protruding portion 510p of the through electrode 510 and by further forming a solder 564 that may selectively reinforce adhesive strength on the metal bump 562. The lower terminal 560 may be aligned with the through electrode 510.

Figure 13J:
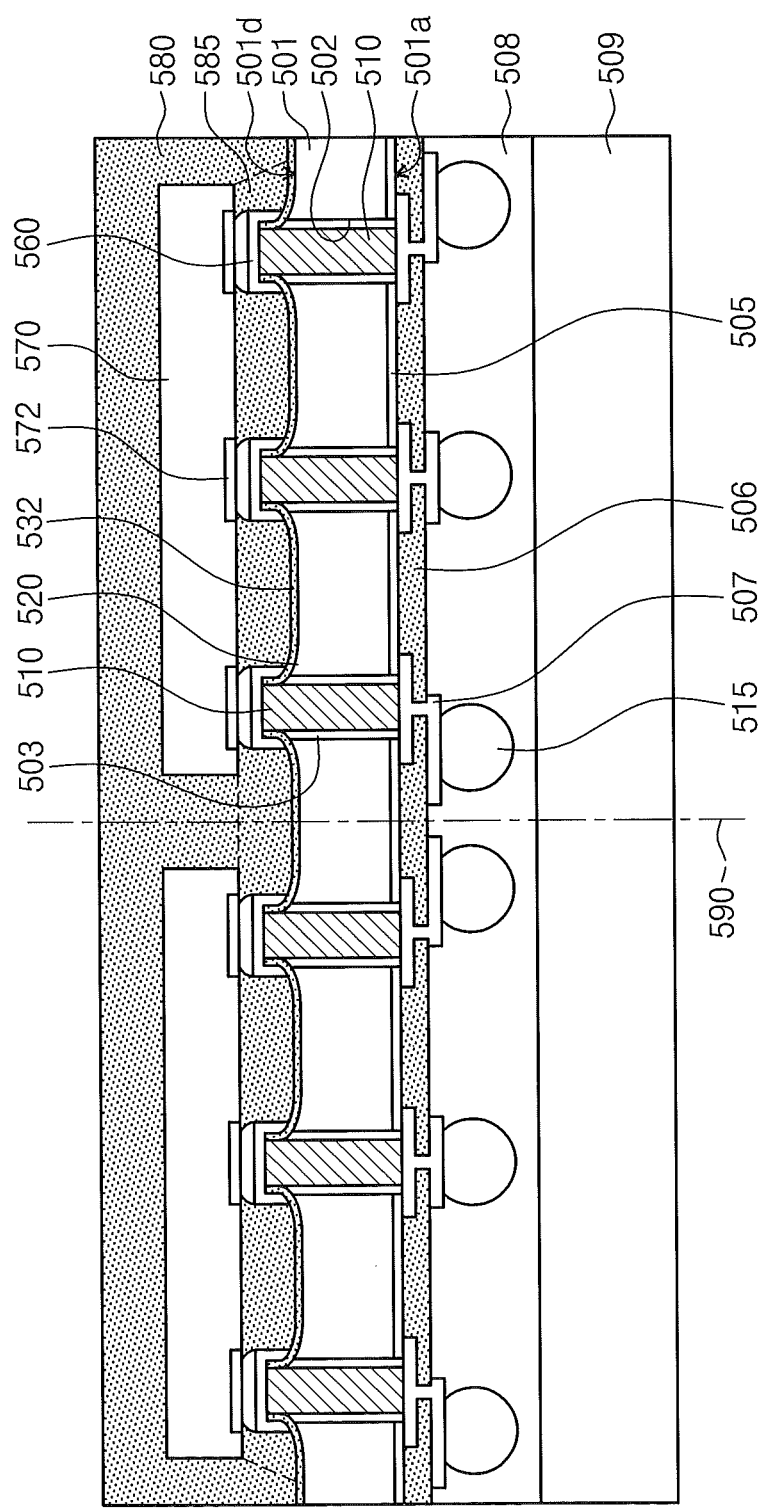

Referring to FIG. 13J, a chip-on-wafer joining or a wafer-level molding process may be performed. For example, a plurality of semiconductor chips 570 may be mounted on the lower surface 501d of the substrate 501, and a wafer-level molding layer 580 may be formed. The semiconductor chip 570 may include a chip pad 572, and the semiconductor chip 570 may be mounted by connecting the chip pad 572 to the lower terminal 560. The semiconductor chip 570 may be mounted in a face-down state as in the present embodiment or in a face-up state differing from the present embodiment. When the semiconductor chip 570 is mounted in a face-up state, the semiconductor chip 570 may include a through electrode 210 electrically connected to the through electrode 510 as identical or similar to the semiconductor device 200 of FIG. 4A.

An under-filling layer 585 may be further formed selectively between the substrate 501 and the semiconductor chips 570 before the forming of the molding layer 580. Since the under-filling layer 585 may further reinforce the bonding between the semiconductor chips 570 and the substrate 501 by surrounding the lower terminal 560, electrical reliability and mechanical durability may be improved.

Subsequently, the molding layer 580, substrate 501, adhesive layer 508, and carrier 509 may be cut along a scribe lane 590 by laser or a cutting wheel. As another example, the adhesive layer 508 and the carrier 509 may be removed from the substrate 501 before the cutting process.

Figure 13K:
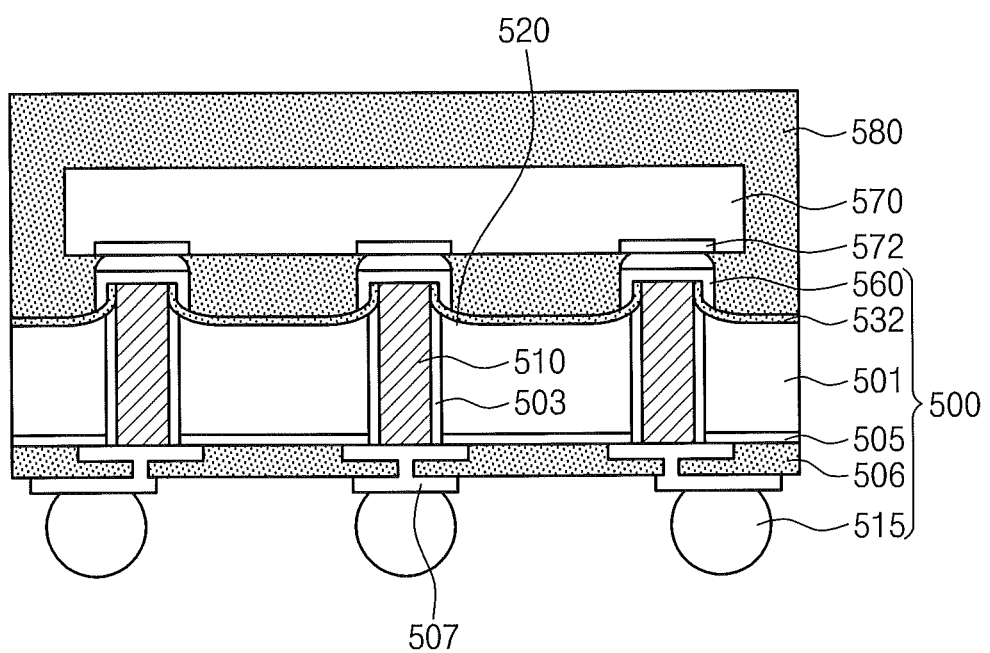

Referring to FIG. 13K, according to the cutting and carrier removal process, a plurality of semiconductor packages 5 may be formed. The semiconductor packages 5 may include the semiconductor device 500 of FIG. 11A, the semiconductor chip 570 mounted on the semiconductor device 500 and the molding layer 580 molding the semiconductor chip 570. The semiconductor package 5 may be selectively mounted on another semiconductor chip or a printed circuit board.

<Further Method Embodiments>

Figure 14A:
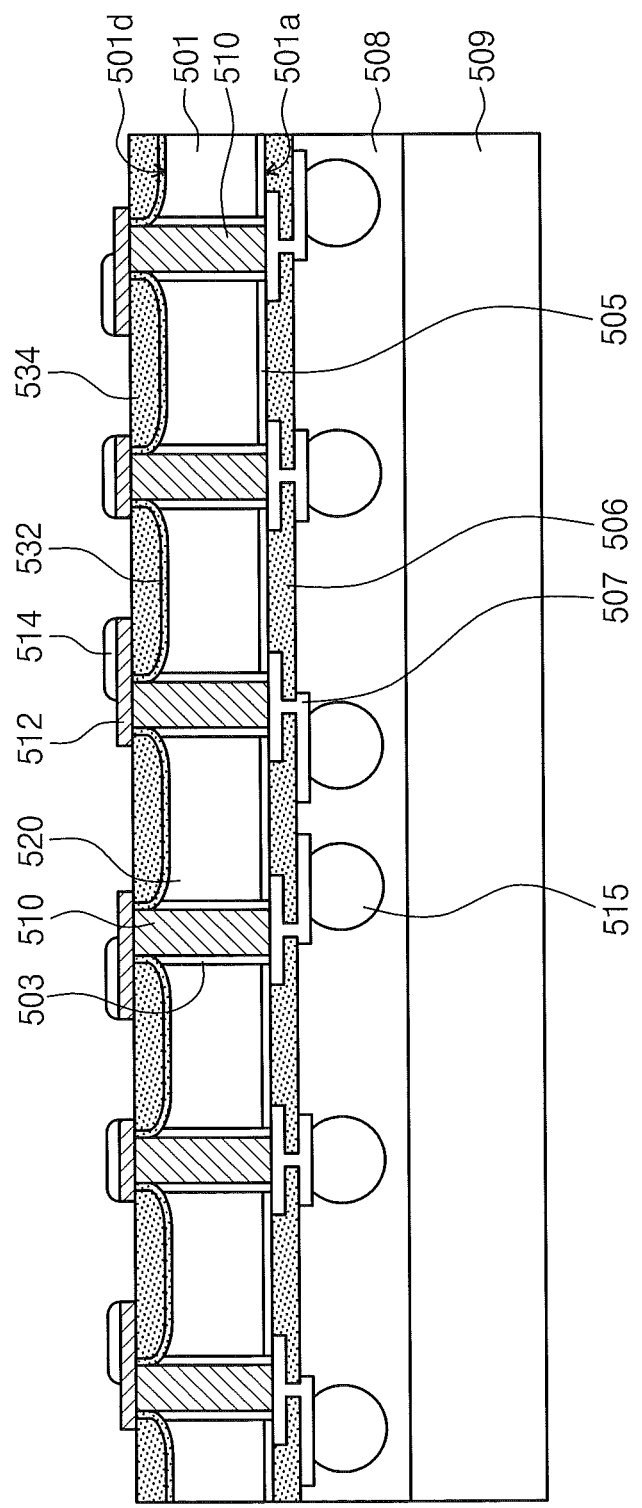
FIGS. 14A through 14C are cross-sectional views illustrating a method of fabricating a semiconductor package including a semiconductor device according to some embodiments of the inventive concept.
Figure 14B:
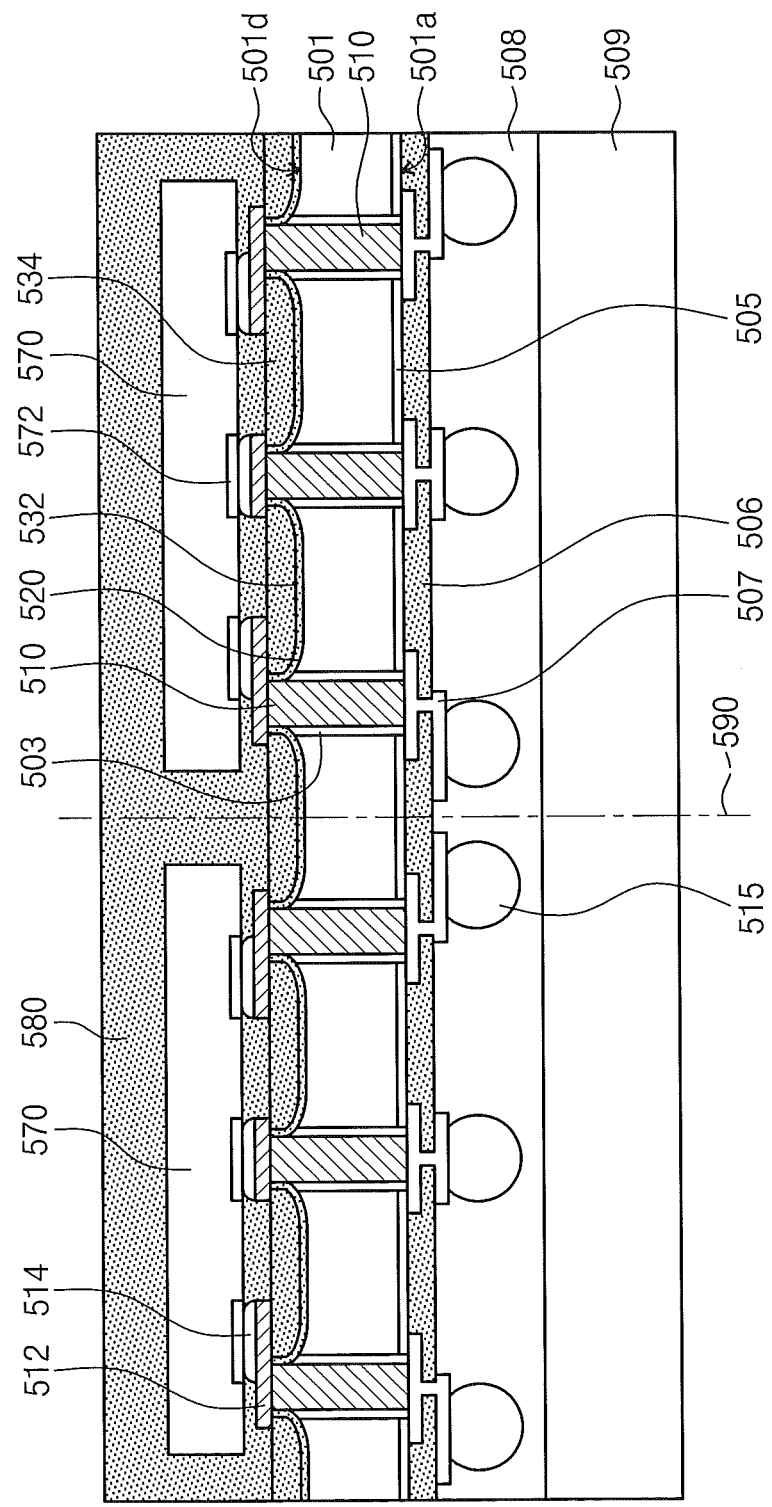
Figure 14C:
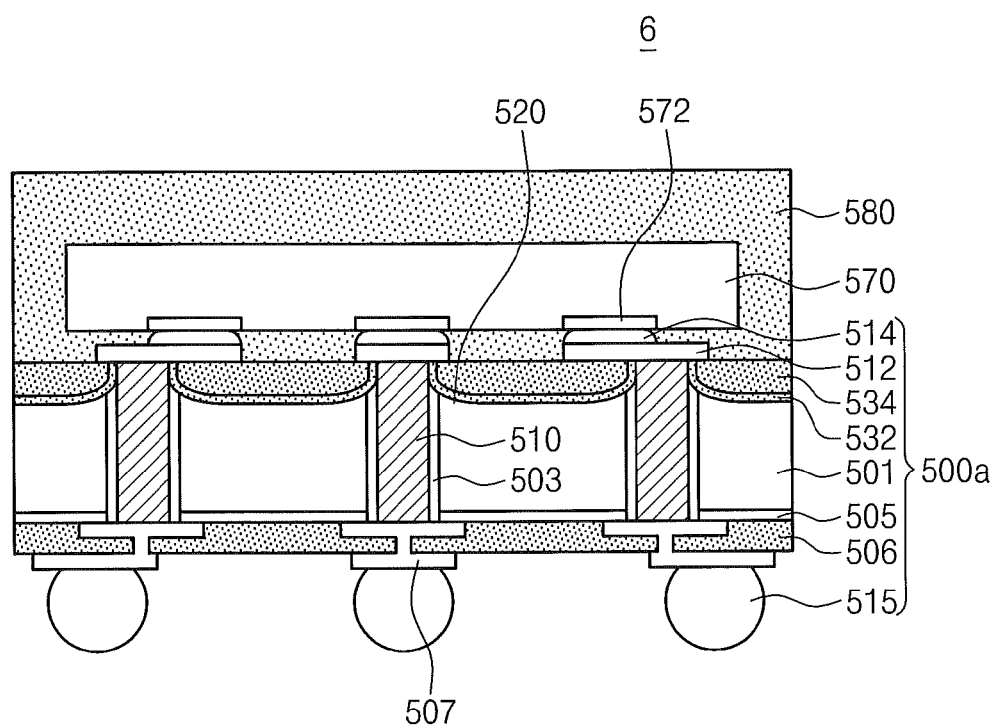

FIGS. 14A through 14C are cross-sectional views illustrating a method for fabricating a semiconductor package including a semiconductor device according to further embodiments of the inventive concept. As the present embodiments are identical or similar to the embodiment of FIGS. 13A through 13K, different points will be described in detail below but identical points will be briefly described or may not be provided.

Referring to FIG. 14A, a through electrode 510 penetrating a substrate 501 may be formed by the identical or similar processes as described in FIGS. 13A through 13H. A tail 520 having an upward slope toward the through electrode 510 may be formed on a lower surface 501d of the substrate 501, and a lower protective layer 532 covering the lower surface 501d may be formed. A lower insulation layer 534 flat covering the lower surface 501d having a recessed shape may be formed. For example, the lower insulation layer 534 exposing the through electrode 510 may be formed by depositing a silicon oxide layer, a silicon nitride layer, polymer (e.g., polyethylene oxide), or combinations thereof and planarization.

A lower metal interconnection 512 may be formed on the lower insulation layer 534. The lower metal interconnection 512 may be redistributed. A lower terminal 514 may be further formed selectively on the lower metal interconnection 512. For example, the lower terminal 514 may be formed in a bump shape by depositing and patterning of a conductor, electroplating, or electroless plating. As another example, the lower terminal 514 may be formed of solder.

Referring to FIG. 14B, a plurality of semiconductor chips 570 may be mounted on the substrate 501 by performing a chip-on-wafer (COW) joining process, and a molding layer 580 may be formed by a wafer-level molding process. The semiconductor chip(s) 570 may be connected to the through electrode 510 by connecting a chip pad 572 to the lower terminal 514. An under-filling layer 585 may be further formed selectively before the forming of the molding layer 580. Carrier 509 and adhesive layer 508 may be removed or a cutting process may be performed along a scribe lane 590 before removing the carrier 509 and the adhesive layer 508.

Referring to FIG. 14C and according to the cutting and carrier removal process, a plurality of semiconductor packages 6 may be formed. The semiconductor package 6 may include the semiconductor device 500a of FIG. 12A, the semiconductor chip 570 mounted on the semiconductor device 500a, and the molding layer 580 molding the semiconductor chip 570.

<Application Example>

Figure 15A:
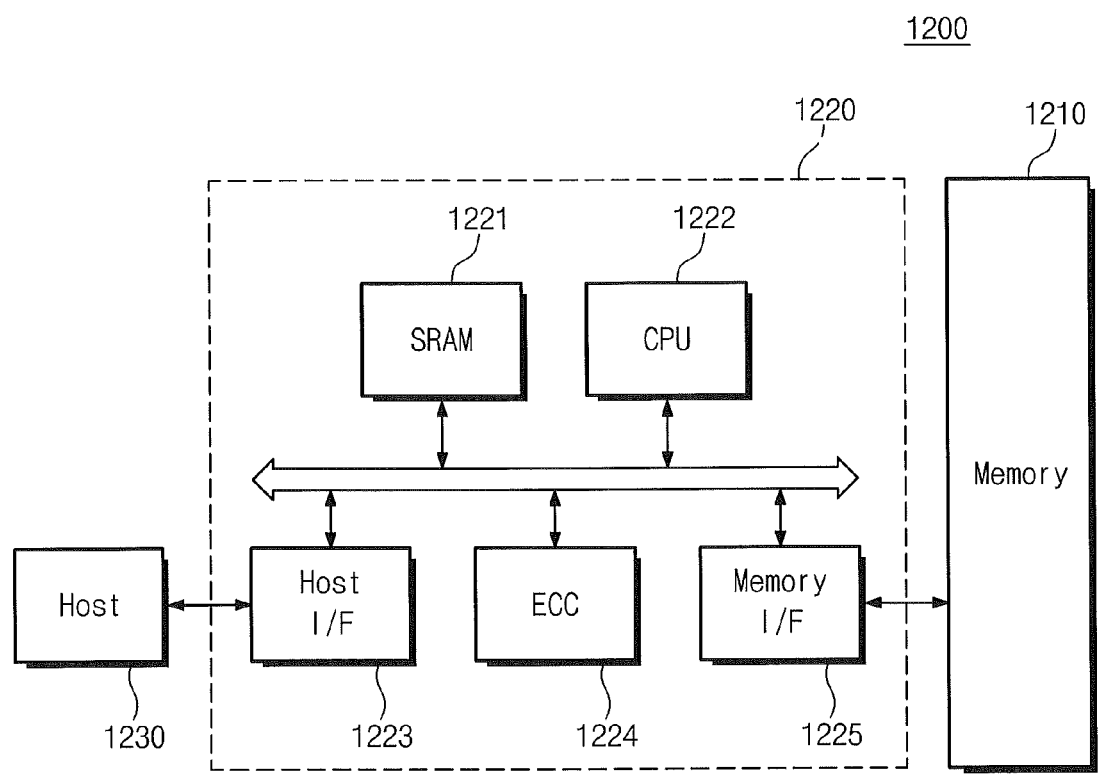
FIG. 15A is a block diagram illustrating a memory card including a semiconductor device according to some embodiments of the inventive concept.
Figure 15B:
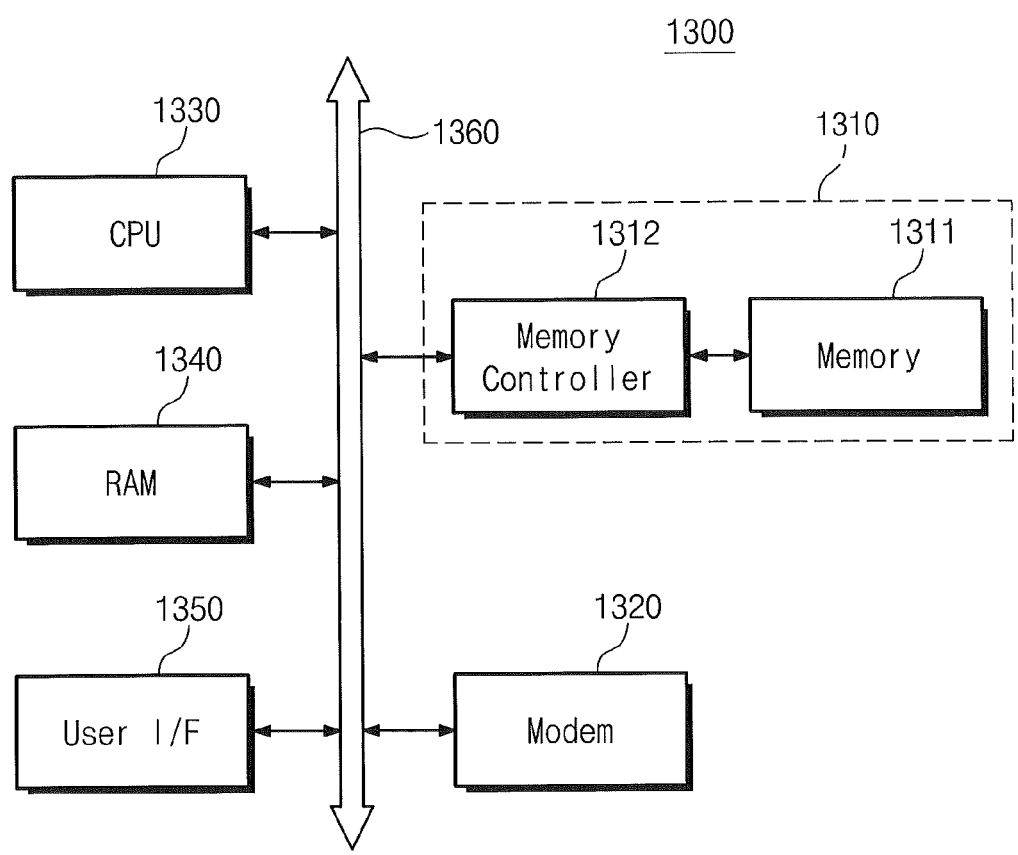
FIG. 15B is a block diagram illustrating an information processing system applying semiconductor devices according to various embodiments of the inventive concept.

FIG. 15A is a block diagram illustrating a memory card including a semiconductor device according to an embodiment of the inventive concept. FIG. 15B is a block diagram illustrating an information processing system applying semiconductor devices according to various embodiments of the inventive concept.

Referring to FIG. 15A, a semiconductor memory 1210 including the foregoing semiconductor devices according to various embodiments of the inventive concept may be applied to the memory card 1200. For example, the memory card 1200 may include a memory controller 1220 that controls various data exchanges between a host and the memory 1210. A static random access memory (SRAM) 1221 may be used as a working memory of a central processing unit 1222. A host interface 1223 may have a data exchange protocol of the host connected to the memory card 1200. An error correction code (ECC) 1224 may detect and correct an error which is included in the data read out from the memory 1210. A memory interface 1225 interfaces with the memory 1210. The central processing unit 1222 performs various control action for data exchange of the memory controller 1220.

Referring to FIG. 15B, a data processing system 1300 may include a memory system 1310 having semiconductor devices according to the embodiments of the inventive concept. The data processing system 1300 may include a mobile device or a computer, etc. For example, the data processing system 1300 may include the memory system 1310, and a modem 1320, a central processing unit 1330, a random access memory (RAM) 1340 and a user interface 1350 which are electrically connected to a system bus 1360, respectively. The memory system 1310 includes memory 1311 and memory controller 1312, and may be composed substantially equal to the memory card 1200 of FIG. 15A. In the memory system 1310, the data processed by the central processing unit 1330 or the data inputted from the outside may be stored. The data processing system 1300 may be supplied with a memory card, a solid state disk, a camera image processor, and other application chipsets. For example, the memory system 1310 may be composed of a solid state disk (SSD), and in this case, the data processing system 1300 may stably and reliably store high volume of data in the memory system 1310.

The semiconductor devices according to the embodiments of the inventive concept may be packaged in various types. Examples of the packages of the semiconductor devices according to the embodiments of the inventive concept may include package on package (PoP), ball grid arrays (BGAs), chip scale packages (CSPs), a plastic leaded chip carrier (PLCC), a plastic dual in-line package (PDIP), a multi chip package (MCP), a wafer-level package (WLP), a wafer-level fabricated package (WFP), a wafer-level stack package (WSP), a die on waffle package, a die in wafer form, a chip on board (COB), a ceramic dual in-line package (CERDIP), a plastic metric quad flat pack (MQFP), a thin quad flat pack (TQFP), a small outline package (SOP), a shrink small outline package (SSOP), a thin small outline package (TSOP), a thin quad flat package (TQFP), a system in package (SIP), and so on.

According to the present inventive concept, a failure phenomenon of a through electrode during processes can be limited or even eliminated through forming a tail surrounding a protruding portion of the through electrode by, for example, properly controlling a chemical mechanical polishing process. Therefore, yields of semiconductor devices can be improved, and semiconductor devices with improved mechanical and electrical characteristics can be fabricated.

As described above, the present disclosure provides semiconductor devices having a through electrode and methods of fabricating the same. The semiconductor devices may have excellent mechanical and electrical characteristics by preventing a through electrode from damaging, and methods for fabricating the same.

Embodiments of the inventive concept may provide a semiconductor device including: a substrate having an upper surface and a lower surface opposite to the upper surface; and a through electrode penetrating the substrate. The through electrode may include a protruding portion protruding from the lower surface, and the substrate may include a supporting portion extending from the lower surface toward the protruding portion to surround a circumferential side of the protruding portion.

In some embodiments, the supporting portion may have a height smaller than a protrusion length of the protruding portion.

In other embodiments, the supporting portion has a height greater than about a half of the protrusion length of the protruding portion and may surround at least about a half of the protruding portion.

In still other embodiments, the supporting portion may have a downward slope as a transverse distance from the protruding portion increases.

In even other embodiments, the supporting portion has a conical shape having an upward slope from the lower surface toward the protruding portion, and the through electrode may be disposed along a central axis of the conically-shaped supporting portion.

In yet other embodiments, the supporting portion may have a right triangular cross-section including a height smaller than a length of the protruding portion and a base having a length greater than the height.

In further embodiments, the base length of the supporting portion may be at least two times the height of the supporting portion.

In still further embodiments, the supporting portion may be composed of the same material as the substrate.

In even further embodiments, the semiconductor device may further include: an insulation layer disposed on a side of the through electrode to electrically insulate the through electrode from the substrate; and a protective layer covering the side of the protruding portion and the lower surface of the substrate.

In yet further embodiments, the through electrode may further include an upper protruding portion protruding from the upper surface and an upper supporting portion extending from the upper surface toward the upper protruding portion to surround a circumferential side of the upper protruding portion.

In much further embodiments of the inventive concept, a method of fabricating a semiconductor device may include: providing a substrate including an upper surface, a lower surface opposite to the upper surface, and a through electrode penetrating the substrate; recessing the lower surface of the substrate to form a recessed lower surface; and forming a protective layer covering the recessed lower surface. The forming of the recessed lower surface may include forming a supporting portion adjacent to a protruding portion of the through electrode protruding from the recessed lower surface.

In still much further embodiments, the forming of the supporting portion may include: protruding the through electrode from the recessed lower surface; and forming the supporting portion having an upward slope toward the protruding portion of the through electrode and surrounding a circumferential side of the protruding portion of the through electrode.

In even much further embodiments, the supporting portion may include a conically-shaped supporting portion having a height greater than about a half of a length of the protruding portion by extending from the recessed lower surface with an upward slope.

In yet much further embodiments, a base length of the supporting portion may be at least two times the height of the supporting portion.

In some embodiments, the recessing of the lower surface of the substrate may include chemical mechanical polishing the lower surface using a slurry including water, silica, and an amine-based compound.

In other embodiments, the forming of the protective layer may include: forming an insulation layer covering the protruding portion of the through electrode and the recessed lower surface; and selectively removing the insulation layer to form the protective layer exposing the protruding portion of the through electrode.

In still other embodiments, the insulation layer may include a folding portion formed on the supporting portion, and a folding angle between a horizontal component and a vertical component of the insulation layer constituting the folding portion may be about 90° or more.

In even other embodiments, the providing of the substrate may include: providing a bare substrate having a thickness greater than the substrate and comprising a first surface and a second surface opposite to the first surface; selectively etching the bare substrate to form a hole extending from the first surface toward the second surface; forming the through electrode in the hole; and grinding the second surface to form the substrate exposing both ends of the through electrode.

In yet other embodiments, the method may further include forming a recessed upper surface by recessing the upper surface of the substrate. The forming of the recessed upper surface may include forming a second supporting portion surrounding a circumferential side of a second protruding portion of the through electrode protruding from the recessed upper surface.

In further embodiments, the substrate may include a wafer-level substrate, the method may further include: mounting a plurality of semiconductor chips on the wafer-level substrate; and forming a wafer-level molding layer molding the semiconductor chips.

In still further embodiments, the method may further include forming an under-filling layer between the semiconductor chips and the wafer-level substrate.

In even further embodiments, the method may further include: separating the wafer-level substrate into a plurality of chip-level substrates; and forming a semiconductor package with the semiconductor chip mounted on the chip-level substrate.

In yet further embodiments, the method may further include: attaching the substrate to a carrier by disposing an adhesive layer therebetween; and removing the carrier before or after separating into the chip-level substrates.

In much further embodiments, the method may further include: forming an upper terminal connected to the through electrode on the upper surface of the substrate; and forming a lower terminal connected to the through electrode on the lower surface of the substrate.

In still much further embodiments, the method may further include forming a redistributed interconnection between at least any one of the upper and lower terminals and the through electrode.

In even much further embodiments of the inventive concept, a method of fabricating a semiconductor device may include: providing a bare substrate including an upper surface, a first lower surface, and a through electrode exposed through the upper surface and not exposed through the first lower surface; grinding the first lower surface to form a substrate having a second lower surface more adjacent to the upper surface than the first lower surface and exposing the through electrode; recessing the second lower surface to form a third lower surface more adjacent to the upper surface than the second lower surface; and forming a protective layer covering the third lower surface. The forming of the third lower surface may include: protruding a portion of the through electrode from the third lower surface; and forming a supporting portion having an upward slope toward a protruding portion of the through electrode protruding from the third lower surface and surrounding a circumferential side of the protruding portion of the through electrode.

In yet much further embodiments, the method may further include attaching a carrier on the bare substrate by disposing an adhesive layer therebetween. The carrier may face the upper surface of the bare substrate.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor device, comprising:
    a substrate having a first surface and an opposite second surface;
    an electrode extending within the substrate towards the first surface and having a protruding portion extending from the first surface; and
    a supporting portion extending from the first surface of the substrate to a sidewall of the protruding portion that supports the protruding portion,
    wherein the supporting portion has a height proximate the sidewall of the protruding portion of at least half of a height of the protruding portion extending from the first surface.

2. The semiconductor device of claim 1, wherein the substrate and the supporting portion comprise a same material.

3. The semiconductor device of claim 1, wherein the supporting portion has a conical shape and the electrode extends along a central axis of the conical shape.

4. The semiconductor device of claim 3, wherein a length of a base of the conical shape from the sidewall of the electrode to a flat portion of the first surface is at least half the height of the supporting portion.

5. The semiconductor device of claim 4, further comprising an insulation layer on the first surface, wherein the insulation layer has an obtuse folding angle of at least 90° on the supporting surface to limit defects in the insulation layer proximate the protruding portion.

6. The semiconductor device of claim 3, wherein the supporting portion surrounds at least half of a circumference of the protruding portion.

7. The semiconductor device of claim 3, further comprising an insulation layer disposed between the electrode and the substrate, wherein the insulation layer disposed between the electrode and the substrate extends on the sidewall of the protruding portion to a height at least equal to the height of the supporting portion.

8. The semiconductor device of claim 3, wherein the protruding portion comprises a first protruding portion and the supporting portion comprises a first supporting portion and wherein the electrode further comprises a second protruding portion extending from the second surface and wherein the semiconductor device further comprises a second supporting portion extending from the second surface of the substrate to a sidewall of the second protruding portion that supports the second protruding portion.

9. The semiconductor device of claim 1, wherein the protruding portion comprises a first protruding portion and the supporting portion comprises a first supporting portion and wherein the electrode further comprises a second protruding portion extending from the second surface and wherein the semiconductor device further comprises a second supporting portion extending from the second surface of the substrate to a sidewall of the second protruding portion that supports the second protruding portion.

10. The semiconductor device of claim 1, wherein the semiconductor device comprises a plurality of electrodes extending through the substrate from the first surface to the second surface, each of which has a protruding portion and the semiconductor device further comprises a plurality of supporting portions, each of which supports a respective one of the protruding portions.

11. The semiconductor device of claim 10, wherein ones of the electrodes have different pitches between each other and wherein a minimum pitch between adjacent ones of the electrodes is small enough so that the first surface of the substrate between the adjacent ones of the electrodes does not include a flat portion as the respective supporting portions of the adjacent ones of the electrodes overlap.

12. A semiconductor package including the semiconductor device of claim 10, further comprising:
    a package substrate having the first side of the semiconductor device mounted thereto and having interconnection lines formed therein, wherein the electrodes are electrically connected to the interconnection lines.

13. The semiconductor package of claim 12, wherein the semiconductor device further comprises a plurality of connecting portions on an upper surface of respective ones of the protruding portion and extending over at least a portion of the supporting portions of the respective ones of the protruding portions that electrically connects the electrodes to the interconnection lines.

14. The semiconductor package of claim 13, wherein the semiconductor device comprises a first semiconductor device having a metal interconnection on the second surface electrically connected to respective ones of the electrodes and wherein the semiconductor package further comprises a second semiconductor mounted on the second surface of the first semiconductor device and having a plurality of electrodes therein that are electrically connected to respective ones of the electrodes of the first semiconductor device through the metal interconnection.

15. A semiconductor device comprising:
    a substrate having an upper surface and a lower surface opposite to the upper surface; and a through electrode penetrating the substrate, wherein the through electrode comprises a protruding portion protruding from the lower surface, and the substrate comprises a supporting portion extending from the lower surface toward the protruding portion to surround a circumferential side of the protruding portion, wherein the supporting portion has a height greater than about a half of a protrusion length of the protruding portion.

16. The semiconductor device of claim 15, wherein the supporting portion has a height smaller than a protrusion length of the protruding portion.

17. The semiconductor device of claim 16, wherein the supporting portion surrounds at least about a half of the protruding portion.

18. The semiconductor device of claim 16, wherein the supporting portion has a downward slope as a transverse distance from the protruding portion increases.

19. The semiconductor device of claim 16, wherein the supporting portion has a conical shape having an upward slope from the lower surface toward the protruding portion, and the through electrode is disposed along a central axis of the conically-shaped supporting portion.

20. The semiconductor device of claim 16, wherein the supporting portion has a right triangular cross-section comprising a height smaller than a length of the protruding portion and a base having a length greater than the height.

21. The semiconductor device of claim 20, wherein the base length of the supporting portion is at least two times the height of the supporting portion.

22. The semiconductor device of claim 15, wherein the supporting portion is composed of the same material as the substrate.

23. The semiconductor device of claim 15, further comprising:
   an insulation layer disposed on a side of the through electrode to electrically insulate the through electrode from the substrate; and
   a protective layer covering the side of the protruding portion and the lower surface of the substrate.

24. The semiconductor device of claim 15, wherein the through electrode further comprises an upper protruding portion protruding from the upper surface and an upper supporting portion extending from the upper surface toward the upper protruding portion to surround a circumferential side of the upper protruding portion.

25. The semiconductor device of claim 5, wherein the insulation layer is not on an upper surface of the protruding portion.

* * * * *